(12) United States Patent
Yamamoto et al.

(10) Patent No.: US 12,267,042 B2
(45) Date of Patent: Apr. 1, 2025

(54) OSCILLATION APPARATUS, QUANTUM COMPUTER, AND CONTROL METHOD

(71) Applicant: NEC Corporation, Tokyo (JP)

(72) Inventors: Tsuyoshi Yamamoto, Tokyo (JP); Yoshihito Hashimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 527 days.

(21) Appl. No.: 17/625,413

(22) PCT Filed: Jun. 26, 2020

(86) PCT No.: PCT/JP2020/025244
§ 371 (c)(1),
(2) Date: Jan. 7, 2022

(87) PCT Pub. No.: WO2021/014887
PCT Pub. Date: Jan. 28, 2021

(65) Prior Publication Data
US 2022/0263467 A1     Aug. 18, 2022

(30) Foreign Application Priority Data

Jul. 19, 2019   (JP) ................................ 2019-133816

(51) Int. Cl.
*H03B 15/00* (2006.01)
*G01C 19/56* (2012.01)
(Continued)

(52) U.S. Cl.
CPC ........... *H03B 15/003* (2013.01); *G01C 19/56* (2013.01); *G01C 19/5607* (2013.01);
(Continued)

(58) Field of Classification Search
CPC ...... H03B 15/003; G06N 10/40; H10N 60/10; G01C 19/5719; G01C 19/56; G01C 19/5607; G01C 19/5649; G01C 19/5642
(Continued)

(56) References Cited

U.S. PATENT DOCUMENTS

| 8,169,231 B2 * | 5/2012 | Berkley | ................. | B82Y 10/00 326/4 |
| 8,195,726 B2 * | 6/2012 | Macready | .............. | G06N 10/00 708/1 |

(Continued)

FOREIGN PATENT DOCUMENTS

| CA | 2968830 A1 * | 11/2018 | ........... G06N 99/002 |
| CN | 107251250 A * | 10/2017 | ............. H01L 27/18 |

(Continued)

OTHER PUBLICATIONS

International Search Report for PCT Application No. PCT/JP2020/025244, mailed on Sep. 24, 2020.

(Continued)

*Primary Examiner* — Stephanie E Bloss
*Assistant Examiner* — Kevin C Butler
(74) *Attorney, Agent, or Firm* — Sughrue Mion, PLLC

(57) ABSTRACT

An oscillation apparatus includes: an oscillator including a resonator and a magnetic-field generation unit, the resonator including a loop circuit and a capacitor, the loop circuit including a first superconducting line, a first Josephson junction, a second superconducting line, and a second Josephson junction connected in a ring shape, the magnetic-field generation unit being configured to apply a magnetic field to the loop circuit, and the oscillator being configured to perform parametric oscillation; a read-out unit for reading out an internal state of the oscillator; and a circuit component in which a coupling strength between the oscillator and (Continued)

the read-out unit is variable. The oscillator is connected to the read-out unit through the circuit component.

17 Claims, 14 Drawing Sheets

(51) Int. Cl.
    *G01C 19/5607*     (2012.01)
    *G01C 19/5642*     (2012.01)
    *G01C 19/5649*     (2012.01)
    *G01C 19/5719*     (2012.01)
    *G06N 10/40*     (2022.01)
    *H10N 60/10*     (2023.01)

(52) U.S. Cl.
    CPC ..... *G01C 19/5642* (2013.01); *G01C 19/5649* (2013.01); *G01C 19/5719* (2013.01); *G06N 10/40* (2022.01); *H10N 60/10* (2023.02)

(58) Field of Classification Search
    USPC ........................................................ 73/504.12
    See application file for complete search history.

(56) References Cited

U.S. PATENT DOCUMENTS

| | | | | |
|---|---|---|---|---|
| 8,854,074 | B2* | 10/2014 | Berkley | G06N 10/00 |
| | | | | 327/528 |
| 10,097,143 | B2* | 10/2018 | Abdo | G06N 10/00 |
| 11,038,095 | B2* | 6/2021 | Huang | H10N 69/00 |
| 2008/0109500 | A1 | 5/2008 | Macready et al. | |
| 2009/0078931 | A1* | 3/2009 | Berkley | B82Y 10/00 |
| | | | | 257/E39.012 |
| 2017/0073106 | A1* | 3/2017 | Dimer | B65D 5/28 |
| 2017/0085231 | A1 | 3/2017 | Abdo | |
| 2018/0000110 | A1* | 1/2018 | Elejalde | A23G 4/062 |
| 2018/0010577 | A1* | 1/2018 | Caponetti | F03D 7/0272 |
| 2018/0017603 | A1* | 1/2018 | Goto | H01P 7/08 |
| 2018/0017803 | A1 | 1/2018 | Goto | |
| 2018/0017978 | A1* | 1/2018 | Goto | H03B 15/003 |
| 2018/0054165 | A1* | 2/2018 | Szöcs | H03F 19/00 |
| 2018/0145631 | A1* | 5/2018 | Berkley | H03H 7/01 |
| 2018/0341874 | A1* | 11/2018 | Puri | G06N 10/00 |
| 2019/0229690 | A1* | 7/2019 | White | H03H 11/04 |
| 2021/0201188 | A1* | 7/2021 | Yamaji | H10N 60/82 |
| 2022/0263467 | A1* | 8/2022 | Yamamoto | H10N 60/10 |
| 2022/0263468 | A1* | 8/2022 | Yamamoto | H10N 60/10 |
| 2022/0399145 | A1* | 12/2022 | Kirichenko | G06N 10/40 |
| 2023/0163762 | A1* | 5/2023 | Yamaji | H03K 17/92 |
| | | | | 327/528 |

FOREIGN PATENT DOCUMENTS

| | | | | | |
|---|---|---|---|---|---|
| CN | 116822641 | A | * | 9/2023 | ............ G06N 10/00 |
| JP | 2017-073106 | A | | 4/2017 | |
| JP | 2018-010577 | A | | 1/2018 | |
| JP | 2018011022 | A | * | 1/2018 | ............ G01R 23/02 |
| JP | 2018-513580 | A | | 5/2018 | |
| JP | 6542165 | B2 | * | 7/2019 | ............ G05D 19/02 |
| WO | WO-2016183213 | A1 | * | 11/2016 | ........... H01L 39/223 |
| WO | 2018/052427 | A1 | | 3/2018 | |

OTHER PUBLICATIONS

S. Puri et al., "Quantum annealing with all-to-all connected nonlinear oscillators," Nature Communications, 2017, Published Jun. 8, 2017, pp. 1-9.

JP Official Communication for JP Application No. 2022-199644, mailed on Feb. 13, 2024 with English Translation.

JP Office Action for JP Application No. 2021-533886, mailed on Nov. 15, 2022 with English Translation.

* cited by examiner

OSCILLATION APPARATUS, QUANTUM COMPUTER, AND CONTROL METHOD

This application is a National Stage Entry of PCT/JP2020/025244 filed on Jun. 26, 2020, which claims priority from Japanese Patent Application 2019-133816 filed on Jul. 19, 2019, the contents of all of which are incorporated herein by reference, in their entirety.

TECHNICAL FIELD

The present invention relates to an oscillation apparatus, a quantum computer, and a control method.

BACKGROUND ART

For example, Patent Literature 1 and Non-patent Literature 1 propose a quantum computer using a network of nonlinear oscillators. The nonlinear oscillators used in such quantum computers are required to have as low losses as possible. In general, such a nonlinear oscillator is coupled to a read-out unit for reading out the internal state of the nonlinear oscillator through a capacitor or the like. In order to reduce the loss of such a nonlinear oscillator as much as possible, it is necessary to make the coupling between the nonlinear oscillator and the read-out unit as weak as possible. However, if the coupling is made as weak as possible, the energy transmitted to the read-out unit decreases, thus making the reading-out difficult. On the other hand, in order to transfer, to the read-out unit, sufficient energy to enable it to perform reading-out, it is necessary to make the coupling between the nonlinear oscillator and the read-out unit strong. However, if the coupling is made strong, the loss of the nonlinear oscillator increases, thus causing a problem that the performance of the quantum computer deteriorates.

As means for solving this problem, Patent Literature 2 discloses an oscillation apparatus including an oscillator and a filter.

A resonator which is a component of the oscillator disclosed in Patent Literature 2 has, for example, a waveguide having a length L. Therefore, there are a plurality of modes in this resonator. In this literature, a mode having the lowest resonance frequency is referred to as a fundamental mode, and the other modes are referred to as higher modes. Further, the higher modes are numbered, in an ascending order of the resonance frequency, as a first order, a second order, and so on.

In the method disclosed in Patent Literature 2, it is possible to make the loss of the fundamental mode used for calculation very small by providing, between the resonator constituting the oscillator and a read-out line, a filter that lets an nth order mode(s) of the resonator pass therethrough but does not let the fundamental mode pass therethrough.

Meanwhile, when the state of the fundament mode is read out, it can be read out by converting the energy of the fundamental mode into the nth order mode, and taking out the generated electromagnetic wave of the nth order mode to the read-out line through the filter, and measuring the taken-out electromagnetic wave. In this way, it is possible to achieve a high On/Off ratio and make the loss of the fundamental mode in the Off-state very small.

CITATION LIST

Patent Literature

Patent Literature 1: Japanese Unexamined Patent Application Publication No. 2017-73106

Patent Literature 2: Japanese Unexamined Patent Application Publication No. 2018-11022

Non Patent Literature

Non-patent Literature 1: S. Puri, et al, "Quantum annealing with all-to-all connected nonlinear oscillators," Nature Comm., 2017.

SUMMARY OF INVENTION

Technical Problem

However, the oscillator disclosed in Patent Literature 2 includes the waveguide having the length L in the resonator. In general, such an oscillator is called a distributed constant-type nonlinear oscillator. The waveguide of a resonator which is a component of such a distributed constant-type nonlinear oscillator has a length roughly equal to the wavelength of an electromagnetic wave corresponding to the oscillation frequency of the nonlinear oscillator on a circuit board. Note that the aforementioned circuit board refers to a substrate on which a Josephson parametric oscillator is formed. In general, the aforementioned oscillation frequency is, for example, about 5 to 10 GHz, so that the length of the waveguide corresponding to this frequency is in the order of millimeters. In fact, in Patent Literature 2, it is mentioned that when the oscillation frequency is 5 GHz, the desirable length L of the waveguide is not shorter than 1 mm and not longer than 4 mm, or not shorter than 2 mm and not longer than 4 mm. Therefore, the length of the waveguide is very long. Consequently, the distributed constant-type resonator, i.e., the distributed constant-type nonlinear oscillator occupies a large area.

Meanwhile, in order to realize a practical quantum computer, it is necessary to integrate, for example, several thousands of nonlinear oscillators on a chip of a several millimeters square. However, the distributed constant-type nonlinear oscillator occupies a very large area as described above, thus making it unsuitable for the above-described integration.

Therefore, it has been required to use lumped constant-type nonlinear oscillators in a practical quantum computer. However, since lumped constant-type nonlinear oscillators do not have higher modes, there is a problem that the method disclosed in Patent Literature 2 cannot be applied to the lumped constant-type nonlinear oscillators. Therefore, there is a demand for a lumped constant-type nonlinear oscillator capable of reducing the loss at a first time point and easily reading out the state of the oscillator at a second time point.

Therefore, an object of the present disclosure is to realize a nonlinear oscillator capable of reducing the loss at a first time point and easily reading out the state of the oscillator at a second time point, and to prevent the circuit of the nonlinear oscillator from occupying a large area.

Solution to Problem

An oscillation apparatus according to a first aspect includes:
  an oscillator including a resonator and magnetic-field generating means, the resonator including a loop circuit and a capacitor, the loop circuit including a first superconducting line, a first Josephson junction, a second superconducting line, and a second Josephson junction connected in a ring shape, the magnetic-field generating means being configured to apply a magnetic field to the loop circuit, and the oscillator being configured to perform parametric oscillation;

read-out means for reading out an internal state of the oscillator; and a circuit component in which a coupling strength between the oscillator and the read-out means is variable, in which a circuit in which the capacitor and the loop circuit are connected in a ring shape is connected to the read-out means through the circuit component.

A control method according to a second aspect includes:

setting a coupling strength between an oscillator and read-out means for reading out an internal state of the oscillator to a first coupling strength, and making the oscillator perform parametric oscillation, the oscillator including a resonator and magnetic-field generating means, the resonator including a loop circuit and a capacitor, the loop circuit including a first superconducting line, a first Josephson junction, a second superconducting line, and a second Josephson junction connected in a ring shape, and the magnetic-field generating means being configured to apply a magnetic field to the loop circuit; and then, setting the coupling strength between the oscillator and the read-out means to a second coupling strength larger than the first coupling strength, and reading out, by the reading-out means, the internal state of the oscillator, in which the capacitor and the loop circuit are connected in a ring shape.

Advantageous Effects of Invention

According to the above-described aspect, it is possible to provide an oscillation apparatus, a quantum computer, and a control method capable of reducing the loss at a first time point and easily reading out the state of the oscillator at a second time point, and to prevent the circuit from occupying a large area.

DESCRIPTION OF EMBODIMENTS

An example embodiment according to the present invention will be described hereinafter with reference to the drawings. Note that a resonator described in the example embodiment is implemented by, for example, lines (wiring lines) formed of a superconductor on a silicon substrate. For example, while Nb (niobium) or Al (aluminum) is, for example, used as a material of this line, any other metal such as Mo (molybdenum) or Ta (tantalum) which is in a superconducting state when it is cooled to an extremely low temperature may be used. Further, in order to achieve the superconducting state, a circuit of the resonator is used in a temperature environment such as 10 mK (milli-Kelvin) achieved in a freezer.

Further, in the following description, the Josephson junction means an element including a structure in which a thin insulating film is sandwiched between a first superconductor and a second superconductor.

As mentioned above, the distributed constant-type Josephson parametric oscillator is not suitable for the integration because the area occupied by the resonator thereof is too large. In contrast to this, since the lumped constant-type Josephson parametric oscillator does not require a distributed constant line, it can be formed in a smaller size than that of the distributed constant-type Josephson parametric oscillator. Therefore, in the following example embodiment, a configuration of a circuit using a lumped constant-type Josephson parametric oscillator (a nonlinear oscillator) will be described. Note that, in the following description, the Josephson parametric oscillator (the nonlinear oscillator) is simply referred to as an oscillator.

First Example Embodiment

Figure 1:
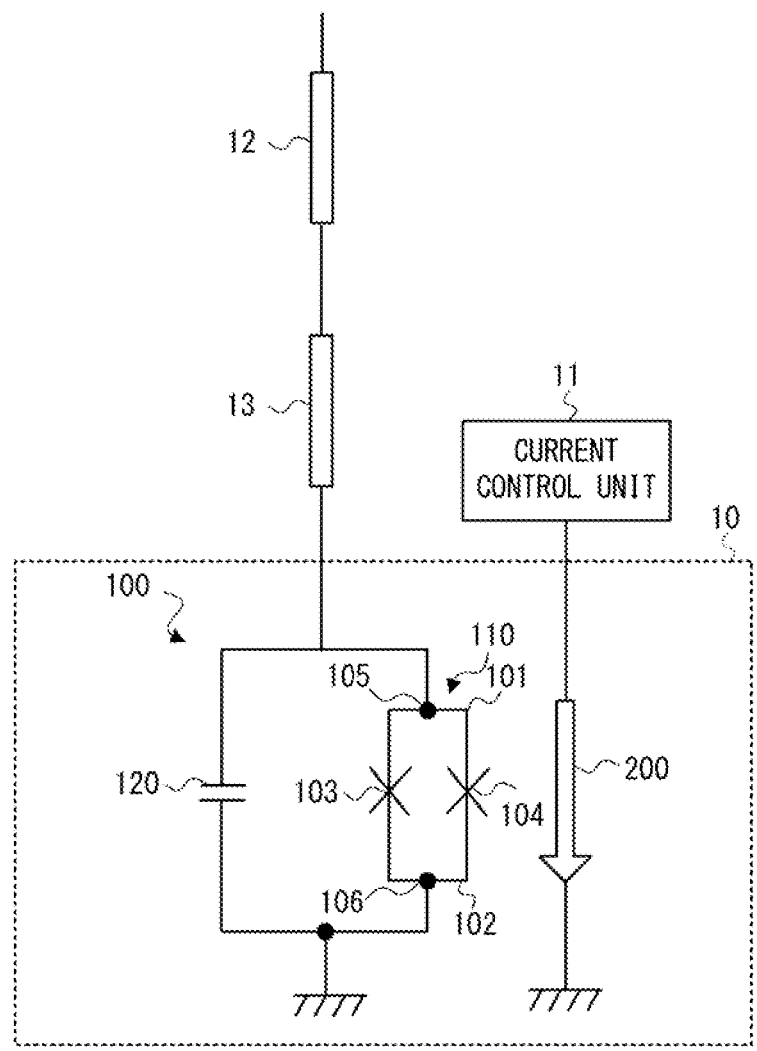
FIG. 1 is a schematic diagram showing an example of an oscillation apparatus including a lumped constant-type oscillator according to a first example embodiment.

FIG. 1 is a schematic diagram showing an example of an oscillation apparatus 1 including a lumped constant-type oscillator 10 according to a first example embodiment.

As shown in FIG. 1, the oscillation apparatus 1 includes, as main components, the oscillator 10, which is a lumped constant-type superconducting nonlinear oscillator, a current control unit 11, a read-out unit 12, and a filter 13.

The oscillator 10 includes a resonator 100 and a magnetic-field generation unit 200. The resonator 100 includes a loop circuit 110 and a capacitor 120. The loop circuit 110 includes a first superconducting line 101 that connects a first Josephson junction 103 and a second Josephson junction 104, and a second superconducting line 102 that connects the first Josephson junction 103 and the second Josephson junction 104. In other words, the resonator 100 includes the loop circuit 110 in which the first and second superconducting lines 101 and 102 are joined by the first and second Josephson junctions 103 and 104, and the capacitor 120. As shown in FIG. 1, the first superconducting line 101, the first Josephson junction 103, the second superconducting line 102, and the second Josephson junction 104 are connected in a ring shape (i.e., in a circular fashion), thereby forming the loop circuit 110. In other words, in the loop circuit 110, the first and second superconducting lines 101 and 102 are joined by the first and second Josephson junctions 103 and 104, thereby forming a loop. That is, it can also be said that the loop circuit 110 is a DC-SQUID (Superconducting QUantum Interference Device).

The loop circuit 110 is shunted by the capacitor 120. That is, a first part 105 of the first superconducting line 101 and a second part 106 of the second superconducting line 102 are shunted by the capacitor 120. In other words, in the resonator 100, the input/output ends of the DC-SQUID are shunted by the capacitor 120. That is, it can be said that, by connecting the capacitor 120 and the loop circuit 110 in a ring shape, a loop circuit in which the loop circuit 110 is incorporated on the line of the loop is formed. Note that, in the following description, a circuit for shunting is also referred to as a shunt circuit. Note that the first part 105 is an arbitrary part of the first superconducting line 101. That is, the position of the first part 105 in the first superconducting line 101 is not limited to any particular place. Similarly, the second part 106 is an arbitrary part of the second superconducting line 102. That is, the position of the second part 106 in the second superconducting line 102 is not limited to any particular place. Note that as shown in FIG. 1, one end of the loop circuit may be connected to the ground.

The magnetic-field generation unit 200 and the resonator 100 are magnetically coupled with each other through the mutual inductance. In other words, the magnetic-field generation unit 200 and the resonator 100 are inductively coupled with each other. The magnetic-field generation unit 200 is a circuit that generates an alternating magnetic field and applies the generated alternating magnetic field to the loop circuit 110. The magnetic-field generation unit 200 is a circuit through which an AC (Alternating Current) current flows, and generates an alternating magnetic field by the AC current. More specifically, a current in which a DC (Direct Current) current and an AC current are superimposed on each other flows through the magnetic-field generation unit 200. As will be described later, the magnitude of the magnetic flux and the height of the oscillation frequency (the resonance frequency) are controlled by the amount of the DC current. The current flowing to the magnetic-field generation unit 200 is controlled by the current control unit 11.

When an AC current is fed to the magnetic-field generation unit 200 so that an alternating magnetic field whose frequency is twice the resonance frequency of the resonator 100 is applied to the loop circuit 110, the oscillator 10 oscillates at this resonance frequency (i.e., the oscillation frequency 0.5 times (i.e., a half of) the frequency of the alternating magnetic field). This oscillation is called parametric oscillation. That is, the oscillator 10 is an oscillator that performs parametric oscillation.

Figure 2:
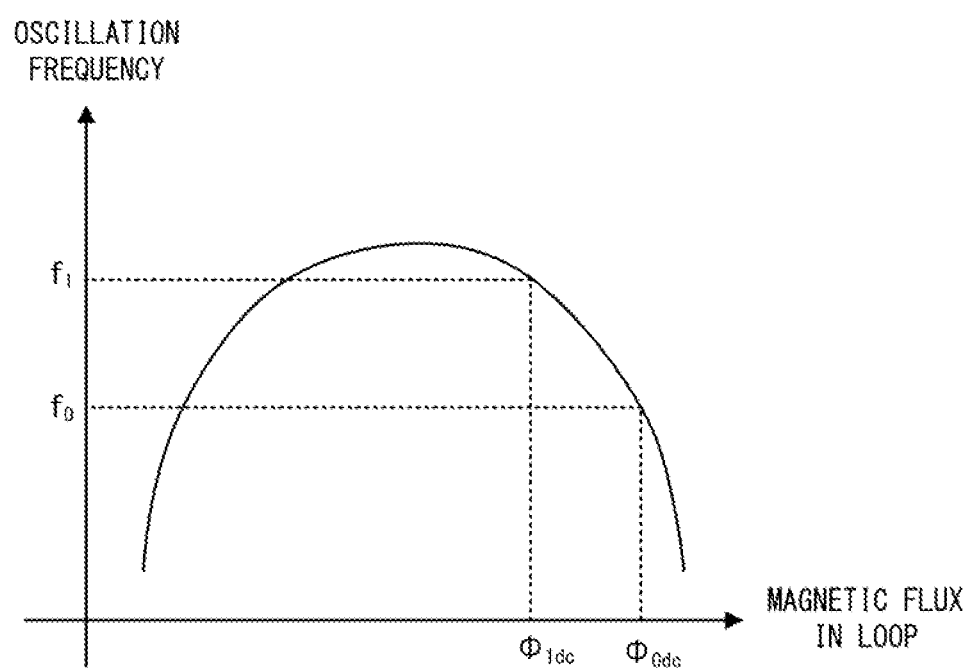
FIG. 2 is a graph showing a relation between magnetic fluxes applied to a loop circuit of an oscillator and oscillation frequencies.

Note that the resonance frequency of the resonator 100, i.e., the oscillation frequency of the oscillator 10, depends on the magnitude of the magnetic flux that passes through the loop of the loop circuit 110. FIG. 2 is a graph showing a relation between the magnetic flux applied to the loop of the loop circuit 110 of the oscillator 10 and the oscillation frequency. The magnitude of the magnetic flux applied to the loop depends on the amount of the current flowing to the magnetic-field generation unit 200. The current control unit 11 controls the magnitude of the magnetic flux applied to the loop by changing the amount of the DC current flowing to the magnetic-field generation unit 200. As shown in FIG. 2, it is possible to control the oscillation frequency (the resonance frequency) by changing the magnetic flux applied to the loop. Although the magnetic-field generation unit 200 is represented by one wiring line in FIG. 1, it may be formed by two wiring lines, and may be configured so that the DC current flows through one of the wiring lines and the AC current flows through the other wiring line.

The current control unit 11 is a control circuit that controls the current flowing through the magnetic-field generation unit 200. In this example embodiment, in particular, the current control unit 11 performs control so that a DC current having a first current value and an AC current having a predetermined frequency flow to the magnetic-field generation unit 200 for a predetermined time. Then, after the predetermined time has elapsed, the current control unit 11 performs control so that a DC current having a second current value different from the first current value flows to the magnetic-field generation unit 200. That is, at a first time point (at the time of quantum calculation), the current control unit 11 performs control so that the DC current having the first current value and the AC current having the predetermined frequency flow to the magnetic-field generation unit 200. Then, next, at a second time point (at the time of reading-out of the internal state of the oscillator 10), the current control unit 11 performs control so that the DC current having the second current value flows to the magnetic-field generation unit 200.

In FIG. 2, a magnetic flux $\Phi_{0dc}$ represents a magnetic flux that is applied to the loop at the time of quantum calculation in this example embodiment. The oscillation frequency (the resonance frequency) at the time when the magnetic flux $\Phi_{0dc}$ is applied to the loop is represented by $f_0$. That is, the frequency $f_0$ is the oscillation frequency of the oscillator 10 (the resonance frequency of the resonator 100) which is determined according to the magnitude of the magnetic flux that passes through the loop circuit 110 when the DC current having the first current value flows through the magnetic-field generation unit 200.

Further, in FIG. 2, the magnetic flux $\Phi_{1dc}$ represents a magnetic flux that is applied to the loop at the time of reading-out in this example embodiment. The oscillation frequency (the resonance frequency) at the time when the magnetic flux $\Phi_{1dc}$ is applied to the loop is represented by $f_1$. That is, the frequency $f_1$ is the oscillation frequency of the oscillator 10 (the resonance frequency of the resonator 100) which is determined according to the magnitude of the magnetic flux that passes through the loop circuit 110 when the DC current having the second current value flows through the magnetic-field generation unit 200.

In this example embodiment, when quantum calculation is performed, the current control unit 11 applies the magnetic flux $\Phi_{0dc}$ having a first magnitude to the loop by feeding the DC current $\Phi_{0dc}$ having the first current value to the magnetic-field generation unit 200. In this way, it is possible to set the oscillation frequency of the oscillator 10 to the first oscillation frequency $f_0$. Meanwhile, when the internal state (the oscillation state) of the oscillator 10 (the resonator 100) is read out, the magnetic flux $\Phi_{1dc}$ having a second magnitude is applied to the loop by feeding the DC current $\Phi_{1dc}$ having the second current value to the magnetic-field generation unit 200. In this way, it is possible to set the oscillation frequency of the oscillator 10 to the second oscillation frequency $f_1$.

The read-out unit 12 is a circuit (a read-out line) for reading out the internal state, i.e., the oscillation state, of the oscillator 10. The oscillator 10 is connected to the read-out unit 12 through the filter 13. That is, the filter 13 is interposed between the oscillator 10 and the read-out unit 12. More specifically, the filter 13 is connected to a shunt circuit (a circuit that shunts the loop circuit 110 by the capacitor 120). That is, the filter 13 is connected to the ring circuit formed by the capacitor 120 and the loop circuit 110.

The filter 13 is a circuit that restricts the transmission of signals in a predetermined frequency band, and is formed by a capacitor and an inductor. More specifically, the filter 13 is a circuit that restricts the transmission of signals in the predetermined frequency band as compared to the transmission of signals in other frequency bands. The filter 13 is, for example, a band-pass filter.

Figure 3:
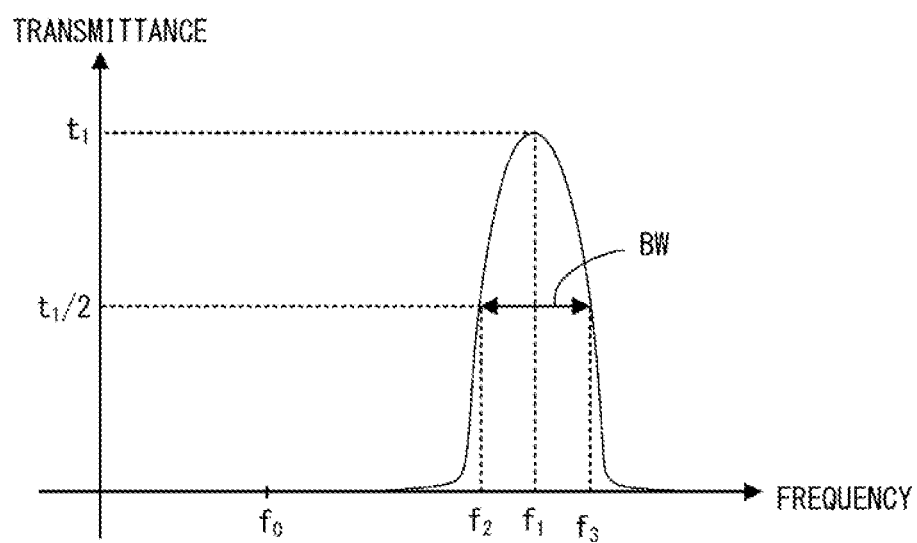
FIG. 3 is a graph showing an example of transmission characteristics of a filter.

FIG. 3 is a graph showing an example of transmission characteristics of the filter 13. As shown in FIG. 3, the filter 13 has a transmission bandwidth BW. The transmission bandwidth can be defined, for example, as a region of frequencies having a transmittance equal to or higher than half of a maximum transmittance ti. In this example embodiment, the filter 13 is designed in advance so that the aforementioned frequency $f_0$, i.e., the oscillation frequency that is set at the time of quantum calculation, is not included in the transmission band thereof and the aforementioned frequency $f_1$, i.e., the oscillation frequency that is set at the time of reading-out, is included in the transmission band thereof. In the example shown in FIG. 3, the filter 13 is designed so that the transmittance of the filter 13 is maximized at the frequency $f_1$. Further, in the example shown in FIG. 3, the transmission band is in a frequency region of not lower than a frequency $f_2$ and not higher than a frequency $f_3$, and the frequency $f_0$ is located outside this region. As described above, the transmittance of the filter 13 for a signal having the frequency $f_0$ is set to a value lower than that for a signal having the frequency $f_1$. In other words, the transmittance of the filter 13 for a signal having the frequency $f_1$ is set to a value higher than that for a signal having the frequency $f_0$.

Although the filter 13 can be implemented by using an arbitrary known technique, a lumped constant-type filter is preferably used in view of the integration. Note that the filter 13 and the read-out unit 12 may be disposed on the chip on which the oscillator 10 is disposed, or may be disposed on a different chip.

In this example embodiment, by the above-described configuration, the oscillation apparatus 1 operates as follows. Firstly, at the time of quantum calculation, the current control unit 11 feeds a current in which a DC current $I_{0dc}$ and an AC current having a frequency twice the first oscillation frequency $f_0$ are superimposed to the magnetic-field generation unit 200. By doing so, the oscillator 10 oscillates at the first oscillation frequency $f_0$. Since the frequency $f_0$ is located outside the transmission band of the filter 13, the loss of the oscillator 10 can be lowered. Meanwhile, when the internal state of the oscillator 10 is read out after the quantum calculation is finished, the current control unit 11 feeds the DC current $I_{1dc}$ to the magnetic-field generation unit 200. By doing so, the oscillation frequency of the oscillator 10 shifts from the frequency $f_0$ to the frequency $f_1$. Since the frequency $f_1$ is within the transmission band of the filter 13, the energy of the oscillator 10 is satisfactorily transmitted to the read-out unit 12, so that the internal state thereof can be easily read out. Note that, in the example shown in FIGS. 2 and 3, the oscillation frequency $f_0$ at the time of quantum calculation is lower than the oscillation frequency $f_1$ at the time of reading-out. However, the oscillation frequency $f_0$ at the time of quantum calculation may be higher than the oscillation frequency $f_1$ at the time of reading-out.

That is, in this example embodiment, the following control is performed. Firstly, the oscillator 10 is made to perform parametric oscillation by feeding a current in which a DC current having the first current value and an AC current having the predetermined frequency are superimposed to the magnetic-field generation unit 200. Next, the internal state of the oscillator 10 is read out by the read-out unit 12 by feeding a DC current having the second current value to the magnetic-field generation unit 200.

As described above, this example embodiment provides an advantageous effect that the loss of the oscillator 10 can be reduced at the time of quantum calculation, and the coupling between the oscillator 10 and the read-out unit 12 can be strengthened at the time of reading out, so that the reading-out can be easily performed. Further, since the oscillator 10 is a lumped constant-type oscillator, the area occupied by the circuit can be reduced. Therefore, according to this example embodiment, it is possible to realize a nonlinear oscillator capable of reducing the loss at a first time point and easily reading out the state of the oscillator at a second time point after the first time point, and to prevent the circuit of the nonlinear oscillator from occupying a large area.

The first example embodiment has been described above, but the specific configuration of the nonlinear oscillator is not limited to the configuration shown in FIG. 1. Another configuration of a nonlinear oscillator which can be adopted in this example embodiment will be described hereinafter.

The oscillator 10 shown in FIG. 1 can be used in a quantum computer. However, in that case, the nonlinearity of the oscillator 10 may be too large to obtain desired performance in the quantum computer. In order to provide a quantum computer having superior performance, the nonlinear oscillator used in the quantum computer is required to have moderate nonlinearity. Note that the nonlinearity of the nonlinear oscillator is quantified by a nonlinear coefficient (which will be described hereinafter). The nonlinear coefficient is a coefficient defined by a coefficient of a nonlinear term of the Hamiltonian of the nonlinear oscillator. In the present disclosure, a value obtained by multiplying the absolute value of the coefficient of the nonlinear term of the Hamiltonian by 12 and then dividing the resultant value by the Planck's constant h is used as the nonlinear coefficient of the nonlinear oscillator.

The Hamiltonian H of the lumped constant-type Josephson parametric oscillator 10 shown in FIG. 1 is expressed by the below-shown Expression (1).

[Expression 1]

$$H = hf_{J0}\left(a^\dagger a + \frac{1}{2}\right) - \frac{E_C}{12}\left(a^\dagger + a\right)^4 \qquad (1)$$

In the Expression (1), h is the Planck's constant, and $f_{J0}$ is the oscillation frequency of the nonlinear oscillator. $a^\dagger$ is a creation operator. a is an annihilation operator. Further, $E_C$ is expressed by the below-shown Expression (2).

[Expression 2]

$$E_C = \frac{e^2}{2C_r} \qquad (2)$$

In the Expression (2), e is the elementary charge and $C_r$ is the capacitance of the capacitor 120 used for the shunting.

Further, $f_{J0}$ in the Expression (1) is expressed by the below-shown Expression (3).

[Expression 3]

$$2\pi f_{J0} = \frac{1}{\sqrt{L_J(C_r + 2C_J)}} \quad (3)$$

In the Expression (3), $C_J$ is the capacitance of each of the first and second Josephson junctions 103 and 104. Meanwhile, in the Expression (3), $L_J$ is the equivalent inductance of the loop circuit 110, and is defined by the below-shown Expression (4).

[Expression 4]

$$L_J = \frac{\Phi_0}{4\pi I_C \cos\left(\frac{\pi\Phi}{2\Phi_0}\right)} \quad (4)$$

In the Expression (4), $I_C$ is the critical current value of each of the first and second Josephson junctions 103 and 104, and $\Phi$ is the magnetic flux applied to the loop circuit 110. Further, $\Phi_0$ is the flux quantum (is about $2.07\times10^{-15}$ Wb). As can be seen from the Expression (4), the equivalent inductance $L_J$ of the loop circuit 110 can be changed by changing the magnetic flux $\Phi$ applied to the loop circuit 110. The magnetic flux $\Phi$ can be changed by changing the amount of the current fed to the magnetic-field generation unit 200. More specifically, the magnetic flux $\Phi$ can be changed by the amount of the DC current superimposed on the AC current fed to the magnetic-field generation unit 200. Further, as can be seen from the Expressions (3) and (4), the oscillation frequency can be controlled by the amount of the current fed to the magnetic-field generation unit 200.

As described above, in the present disclosure, the nonlinear coefficient K of the nonlinear oscillator is defined as the value obtained by multiplying the absolute value of the coefficient of the nonlinear term of the Hamiltonian of the nonlinear oscillator by 12 and then dividing the resultant value by the Planck's constant h. In the Hamiltonian of the Expression (1), the second term, i.e., the term $(a^{\dagger}+a)^4$, is the nonlinear term. Therefore, the nonlinear coefficient K of the nonlinear oscillator shown in FIG. 1 is expressed by the below-shown Expression (5).

[Expression 5]

$$K = \frac{E_C}{h} = \frac{e^2}{2hC_r} \quad (5)$$

From the Expression (5), it can be understood that the nonlinear coefficient K of the nonlinear oscillator shown in FIG. 1 is determined by the value of the capacitance $C_r$ of the capacitor 120.

It should be noted that when the quantum computer disclosed in Patent Literature 1 or Non-patent Literature 1 is manufactured, the oscillation frequency of the nonlinear oscillator is desirably not lower than 5 GHz and not higher than 40 GHz. The reason for this is as follows. When the frequency is lower than 5 GHz, the probability of a malfunction of the quantum computer due to thermal noises increases to a non-negligible level. When the frequency is higher than 40 GHz, very expensive high-frequency electronic devices and very expensive high-frequency electronic components are required to operate the quantum computer. Therefore, an oscillation frequency not lower than 5 GHz and not higher than 40 GHz is desirably used.

Further, the critical current value $I_C$ of each of the first and second Josephson junctions 103 and 104 constituting the nonlinear oscillator is desirably not smaller than 10 nA and not larger than 0.1 mA. The reason for this is as follows. When the critical current value $I_C$ is smaller than 10 nA, the output signal of the nonlinear oscillator is too small, causing a problem that the reading-out thereof becomes difficult. Further, when the critical current value $I_C$ is larger than 0.1 mA, the equivalent inductance $L_J$ of the loop circuit 110 decreases, so that the capacitance $C_r$ of the capacitor 120 must be increased in order to achieve the predetermined oscillation frequency $f_{J0}$. As a result, there is a problem that the loss of the nonlinear oscillator increases to a non-negligible level. The fact that the equivalent inductance $L_J$ of the loop circuit 110 decreases as the critical current value increases can be understood from the fact that the equivalent inductance $L_J$ decreases as the critical current value $I_C$ increases in the Expression (4). The reason why the capacitance $C_r$ has to be increased to achieve the predetermined oscillation frequency $f_{J0}$ can be understood from the fact that when the equivalent inductance $L_J$ is reduced in the Expression (3), the predetermined $f_{J0}$ cannot be maintained unless the capacitance $C_r$ is increased. The reason why the loss increases as the capacitance $C_r$ increases is as follows. That is, in order to manufacture a large capacitance in a sufficiently small area suitable for an integrated circuit, it is necessary to use a capacitor having a multi-layered structure. However, in the case of the capacitor having a multi-layered structure, it is difficult to manufacture, by using the existing technology, a dielectric layer the loss caused by which is small. Note that the dielectric layer is a layer of a dielectric material formed between two electrodes of a capacitor. In order to sufficiently reduce the loss, the capacitance $C_r$ is desirably smaller than 1 pF.

Meanwhile, the nonlinear coefficient K is desirably not lower than 1 MHz and not higher than 10 MHz in a quantum computer. The reason for this is as follows. When the nonlinear coefficient K is lower than 1 MHz, the time required for quantum calculation becomes too long, causing a problem that the quantum calculation cannot be completed in the period during which the quantum computer is maintaining the quantum state. Further, when the nonlinear coefficient K is higher than 10 MHz, the output signal of the nonlinear oscillator becomes too small, causing a problem that the reading-out thereof becomes difficult.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux $\Phi$ was set to $0.3\Phi_0$ in the Expression (4). The reason why the value of the magnetic flux $\Phi$ was set to $0.3\Phi_0$ is that when the magnetic flux $\Phi$ is too small, the nonlinear oscillator becomes less likely to oscillate. On the other hand, when the magnetic flux $\Phi$ is too large, it becomes sensitive to magnetic-field noises and hence the oscillation frequency becomes unstable. Therefore, the oscillator is desirably operated with the magnetic flux $\Phi$ of about $0.3\Phi_0$. Further, the capacitance $C_J$ of the Josephson junction is not smaller than 0.1 fF and not larger than 1 pF in the existing component manufacturing technology. For these values of the equivalent inductance $L_J$ and the capacitance $C_J$, the capacitance $C_r$ with which the oscillation frequency $f_{J0}$ of the Josephson parametric oscillator 10 shown in FIG. 1 falls within a range of not lower than 5 GHz and not higher than 40 GHz can be calculated by using the Expression (3). Further, the nonlinear coefficient K for the calculated capacitance $C_r$ can be calculated by using the Expression (5). When the nonlinear coefficient K in the Josephson parametric oscillator 10 in FIG. 1 is actually calculated, the nonlinear coefficient K does not fall within the range of not lower than 1 MHz and not higher than 10 MHz. Alternatively, even when the nonlinear coefficient K falls within the range of not lower than 1 MHz and not higher than 10 MHz, the capacitance $C_r$ becomes larger than 1 pF.

As described above, in the Josephson parametric oscillator 10 shown in FIG. 1, when it is attempted to achieve the desired oscillation frequency by using a Josephson junction(s) having a desired critical current value, it is not always easy to achieve both moderate nonlinearity and a low loss required for a quantum computer.

Therefore, as a modified example of the above-described first example embodiment, a configuration of an oscillator which can achieving both moderate nonlinearity and a low loss, and can prevent the oscillator from occupying a larger area will be described hereinafter in detail. Note that in the following description, the same reference numerals (or symbols) are used for the same components that are already described above, and detailed descriptions thereof are omitted as appropriate. Further, redundant descriptions of the definitions of variables in expressions are also omitted as appropriate.

First and second modified examples described hereinafter are in common to each other in that the loop circuit 110 is shunted by a capacitor and a linear inductor. However, in the first modified example, the capacitor and the linear inductor, which are used for the shunting, are connected in series. In contrast to this, in the second modified example, the capacitor and the linear inductor, which are used for the shunting, are connected in parallel.

First Modified Example

Figure 4:
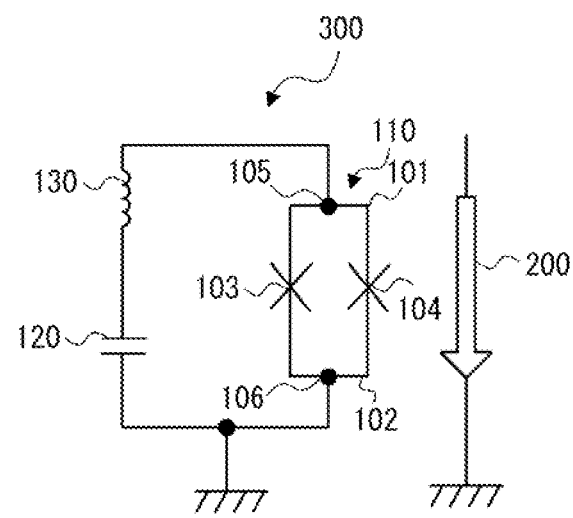
FIG. 4 is a schematic diagram showing a configuration of an oscillator according to a first modified example.

FIG. 4 is a schematic diagram showing a configuration of a superconducting nonlinear oscillator (a Josephson parametric oscillator) according to a first modified example. As shown in FIG. 4, an oscillator 20 includes a resonator 300 and a magnetic-field generation unit 200. The resonator 300 includes a loop circuit 110, a capacitor 120, and a linear inductor 130. The loop circuit 110 includes a first superconducting line 101 that connects a first Josephson junction 103 and a second Josephson junction 104, and a second superconducting line 102 that connects the first and second Josephson junctions 103 and 104. In other words, the resonator 300 includes the loop circuit 110 in which the first superconducting line 101 and the second superconducting line 102 are joined by the first and second Josephson junctions 103 and 104, the capacitor 120, and the linear inductor 130.

In the resonator 300, the loop circuit 110 is shunted by a circuit in which the capacitor 120 and the linear inductor 130 are connected in series. That is, the first part 105 of the first superconducting line 101 and the second part 106 of the second superconducting line 102 are shunted by the capacitor 120 and the linear inductor 130 connected in series. In other words, in the resonator 300, the input/output ends of the DC-SQUID are shunted by the capacitor 120 and the linear inductor 130 connected in series. That is, it can be said that, by connecting the series circuit composed of the capacitor 120 and the linear inductor 130 with the loop circuit 110 in a ring shape, a loop circuit in which the loop circuit 110 is incorporated on the line of the loop is formed. Note that as shown in FIG. 4, one end of the loop circuit may be connected to the ground.

The magnetic-field generation unit 200 and the resonator 300 are magnetically coupled with each other through the mutual inductance. In other words, the magnetic-field generation unit 200 and the resonator 300 are inductively coupled with each other. In the configuration shown in FIG. 4, parametric oscillation is also performed by the generation of an alternating magnetic field. That is, when an AC current is fed to the magnetic-field generation unit 200 so that an alternating magnetic field whose frequency is twice the resonance frequency of the resonator 300 is applied to the loop circuit 110, the oscillator 20 oscillates at this resonance frequency (i.e., the oscillation frequency 0.5 times (i.e., a half of) the frequency of the alternating magnetic field). Note that the frequency of the alternating magnetic field is equal to the frequency of the AC current. Further, in this modified example, as can be seen from the Expression (4) and the below-described Expression (8), the oscillation frequency can be controlled by the amount of the current fed to the magnetic-field generation unit 200. Although the magnetic-field generation unit 200 is represented by one wiring line in FIG. 4, it may be formed by two wiring lines, and may be configured so that the DC current flows through one of the wiring lines and the AC current flows through the other wiring line.

The Hamiltonian H of the oscillator 20 shown in FIG. 4 (the Hamiltonian H of the resonator 300) is expressed by the below-shown Expression (6).

[Expression 6]

$$H = hf_0\left(a^\dagger a + \frac{1}{2}\right) - \frac{E_C}{12}\left(\frac{L_J}{L_r + L_J}\right)^3 (a^\dagger + a)^4 \quad (6)$$

In the Expression (6), $L_r$ is the inductance of the linear inductor 130. Further, $f_0$ is the oscillation frequency of the oscillator 20. In the Hamiltonian H in the Expression (6), the second term, i.e., the term $(a^\dagger+a)^4$, is the nonlinear term. Therefore, the nonlinear coefficient K of the oscillator 20 in this modified example is shown by the below-shown Expression (7).

[Expression 7]

$$K = \frac{E_C}{h}\left(\frac{L_J}{L_r + L_J}\right)^3 = \frac{e^2}{2hC_r}\left(\frac{L_J}{L_r + L_J}\right)^3 \quad (7)$$

When $L_r=0$ in the Expression (7), the nonlinear coefficient K (i.e., the Expression (7)) becomes identical to the Expression (5). This fact corresponds to the fact that when the linear inductor 130 is removed from the oscillator 20 in this modified example, it becomes the nonlinear oscillator shown in FIG. 1. In other words, the oscillator 20 according to this modified example is an oscillator that is obtained by inserting the linear inductor 130 in the nonlinear oscillator shown in FIG. 1. As can be seen from the Expression (7), the larger the inductance $L_r$ of the linear inductor 130 is, the more the nonlinear coefficient K can be reduced. Therefore, in the oscillator 20 according to this modified example, it is possible to reduce the nonlinear coefficient K to a moderate value required for a quantum computer without increasing the capacitance $C_r$ of the capacitor 120 used for the shunting. Therefore, it provides an advantageous effect that the nonlinear coefficient can be lowered to a moderate value required for a quantum computer without increasing the loss of the nonlinear oscillator.

Note that the oscillation frequency $f_0$ of the oscillator 20 according to this modified example shown in FIG. 4 is expressed by the below-shown Expression (8). Note that, in the Expression (8), the capacitance $C_J$ of each of the first and second Josephson junctions 103 and 104 is ignored. This is because the effect of the capacitance of the Josephson junction is negligibly small in the circuit shown in FIG. 4.

[Expression 8]

$$2\pi f_0 = \frac{1}{\sqrt{(L_r + L_J)C_r}} \qquad (8)$$

In this modified example, the oscillation frequency $f_0$ of the oscillator 20 is also preferably not lower than 5 GHz and not higher than 40 GHz. Further, the critical current value $I_C$ of each of the first and second Josephson junctions 103 and 104 constituting the oscillator 20 is preferably not smaller than 10 nA and not larger than 0.1 mA.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux $\Phi$ was set to $0.3\Phi_0$ in the Expression (4). When the equivalent inductance is not smaller than 1.85 pH and not larger than 18.5 nH, it is possible to adopt, based on the Expression (8), various combinations of the inductance $L_r$ and the capacitance $C_r$ with which the oscillation frequency $f_0$ of the oscillator 20 falls within the range of not lower than 5 GHz and not higher than 40 GHz. From among such combinations, by using (i.e., selecting) a combination of the inductance $L_r$ and the capacitance $C_r$ with which the nonlinear coefficient K in the Expression (7) can be adjusted to a value not lower than 1 MHz and not higher than 10 MHz, it is possible to realize a nonlinear oscillator having a moderate nonlinearity required for a quantum computer.

For example, assume that: the oscillation frequency $f_0$ is selected to be 10 GHz; the critical current value $I_C$ of the Josephson junction is 0.83 µA; the capacitance $C_r$ is 0.57 pF; and the inductance $L_r$ is 225 pH. Then, the nonlinear coefficient K is calculated as 4.2 MHz. That is, in this case, it is possible to achieve a moderate nonlinearity required for a quantum computer.

As described above, the value of the inductance of the linear inductor 130 is set in advance based on the equivalent inductance $L_J$, the oscillation frequency $f_0$, the critical current value $I_C$ of the Josephson junction(s), and the capacitance $C_r$ so that the nonlinear coefficient K has a predetermined value. That is, the linear inductor 130 is designed so that its inductance is not a floating inductance but has a predetermined value. In other words, the linear inductor 130 is an inductor that exists as a non-floating component. For example, the linear inductor 130 may be provided as a meander wiring line or as a coil, but how to provide (or form) the linear inductor 130 is not limited to these examples.

Second Modified Example

Next, a second modified example will be described. In the first modified example, the capacitor and the linear inductor, which are used for the shunting, are connected in series. In contrast, in the second modified example, the capacitor and the linear inductor, which are used for the shunting, are connected in parallel.

Figure 5:
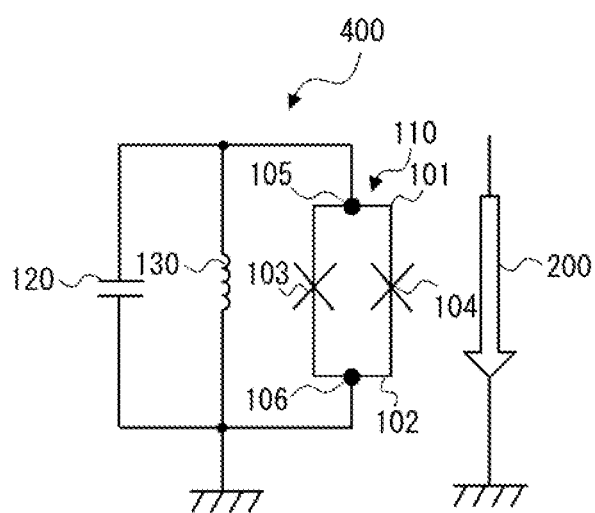
FIG. 5 is a schematic diagram showing a configuration of an oscillator according to a second modified example.

FIG. 5 is a schematic diagram showing a configuration of a superconducting nonlinear oscillator (a Josephson parametric oscillator) according to a second modified example. As shown in FIG. 5, an oscillator 30 includes a resonator 400 and a magnetic-field generation unit 200. The resonator 400 includes a loop circuit 110, a capacitor 120, and a linear inductor 130. The loop circuit 110 includes a first superconducting line 101 that connects a first Josephson junction 103 and a second Josephson junction 104, and a second superconducting line 102 that connects the first and second Josephson junctions 103 and 104. In other words, the resonator 400 includes the loop circuit 110 in which the first and second superconducting lines 101 and 102 are joined by the first and second Josephson junctions 103 and 104, the capacitor 120, and the linear inductor 130.

In the resonator 400, the loop circuit 110 is shunted by a circuit in which the capacitor 120 and the linear inductor 130 are connected in parallel. That is, the first part 105 of the first superconducting line 101 and the second part 106 of the second superconducting line 102 are shunted by the capacitor 120 and the linear inductor 130 connected in parallel. In other words, in the resonator 400, the input/output ends of the DC-SQUID are shunted by the capacitor 120 and the linear inductor 130 connected in parallel. That is, it can be said that, by connecting the parallel circuit composed of the capacitor 120 and the linear inductor 130 with the loop circuit 110 in a ring shape, a loop circuit in which the loop circuit 110 is incorporated on the line of the loop is formed. Note that as shown in FIG. 5, one end of the loop circuit may be connected to the ground.

The magnetic-field generation unit 200 and the resonator 400 are magnetically coupled with each other through the mutual inductance. In other words, the magnetic-field generation unit 200 and the resonator 400 are inductively coupled with each other. In the configuration shown in FIG. 5, parametric oscillation is also performed by the generation of an alternating magnetic field. That is, when an AC current is fed to the magnetic-field generation unit 200 so that an alternating magnetic field whose frequency is twice the resonance frequency of the resonator 400 is applied to the loop circuit 110, the oscillator 30 oscillates at this resonance frequency (i.e., the oscillation frequency 0.5 times (i.e., a half of) the frequency of the alternating magnetic field). Note that the frequency of the alternating magnetic field is equal to the frequency of the AC current. Further, in this modified example, as can be seen from the Expression (4) and the below-described Expression (11), the oscillation frequency can be controlled by the amount of the current fed to the magnetic-field generation unit 200. Although the magnetic-field generation unit 200 is represented by one wiring line in FIG. 5, it may be formed by two wiring lines, and may be configured so that the DC current flows through one of the wiring lines and the AC current flows through the other wiring line.

The Hamiltonian H of the oscillator 30 shown in FIG. 5 (the Hamiltonian H of the resonator 400) is expressed by the below-shown Expression (9).

[Expression 9]

$$H = hf_0\left(a^\dagger a + \frac{1}{2}\right) - \frac{E_C}{12}\frac{L_r}{L_r + L_J}\left(a^\dagger + a\right)^4 \qquad (9)$$

In the Expression (9), $L_r$ is the inductance of the linear inductor 130 shown in FIG. 5. Further, $f_0$ is the oscillation frequency of the oscillator 30. In the Hamiltonian H in the Expression (9), the second term, i.e., the term $(a^\dagger+a)^4$, is the nonlinear term. Therefore, the nonlinear coefficient K of the oscillator 30 in this modified example is shown by the below-shown Expression (10).

[Expression 10]

$$K = \frac{E_C}{h} \frac{L_r}{L_r+L_J} = \frac{e^2}{2hC_r} \frac{L_r}{L_r+L_J} = \frac{e^2}{2hC_r} \frac{1}{1+L_J/L_r} \quad (10)$$

When $L_r=\infty$ in the Expression (10), the nonlinear coefficient K (i.e., the Expression (10)) becomes identical to the Expression (5). This fact corresponds to the fact that when the linear inductor 130 is removed from the oscillator 30 in this modified example, it becomes the nonlinear oscillator shown in FIG. 1. In other words, the oscillator 30 according to this modified example is an oscillator that is obtained by inserting the linear inductor 130 in the nonlinear oscillator shown in FIG. 1. As can be seen from the Expression (10), the smaller the inductance $L_r$ of the linear inductor 130 is, the more the nonlinear coefficient K can be reduced. Therefore, in the oscillator 30 according to this modified example, it is possible to reduce the nonlinear coefficient K to a moderate value required for a quantum computer without increasing the capacitance $C_r$ of the capacitor 120 used for the shunting. Therefore, it provides an advantageous effect that the nonlinear coefficient can be lowered to a moderate value required for a quantum computer without increasing the loss of the nonlinear oscillator.

Note that the oscillation frequency $f_0$ of the oscillator 30 according to this modified example shown in FIG. 5 is expressed by the below-shown Expression (11).

[Expression 11]

$$2\pi f_0 = \frac{1}{\sqrt{\frac{L_r L_J}{L_r+L_J}(C_r+2C_J)}} \quad (11)$$

In this modified example, the oscillation frequency $f_0$ of the oscillator 30 is also preferably not lower than 5 GHz and not higher than 40 GHz. Further, the critical current value $I_C$ of each of the first and second Josephson junctions 103 and 104 constituting the oscillator 30 is preferably not smaller than 10 nA and not larger than 0.1 mA.

When the critical current value $I_C$ of the Josephson junction is adjusted to a value not smaller than 10 nA and not larger than 0.1 mA, the equivalent inductance $L_J$ of the loop circuit 110 falls within a range of not smaller than 1.85 pH and not larger than 18.5 nH according to the Expression (4). Note that, for the calculation, the value of the magnetic flux $\Phi$ was set to $0.3\Phi_0$ in the Expression (4). When the equivalent inductance is not smaller than 1.85 pH and not larger than 18.5 nH, it is possible to adopt, based on the Expression (11), various combinations of the inductance $L_r$ and the capacitance $C_r$ with which the oscillation frequency $f_0$ of the oscillator 30 falls within the range of not lower than 5 GHz and not higher than 40 GHz. From among such combinations, by using (i.e., selecting) a combination of the inductance $L_r$ and the capacitance $C_r$ with which the nonlinear coefficient K in the Expression (10) can be adjusted to a value not lower than 1 MHz and not higher than 10 MHz, it is possible to realize a nonlinear oscillator having a moderate nonlinearity required for a quantum computer.

For example, assume that: the oscillation frequency $f_0$ is selected to be 10 GHz; the critical current value $I_C$ of the Josephson junction is 0.83 µA; the capacitance $C_r$ is 0.57 pF; and the inductance $L_r$ is 30 pH. Then, the nonlinear coefficient K is calculated as 4.0 MHz. That is, in this case, it is possible to achieve a moderate nonlinearity required for a quantum computer.

As described above, the value of the inductance of the linear inductor 130 is set in advance based on the equivalent inductance $L_J$, the oscillation frequency $f_0$, the critical current value $I_C$ of the Josephson junction(s), and the capacitance $C_r$ so that the nonlinear coefficient K has a predetermined value. That is, the linear inductor 130 is designed so that its inductance is not a floating inductance but has a predetermined value. In other words, the linear inductor 130 is an inductor that exists as a non-floating component.

Third Modified Example

Figure 6:
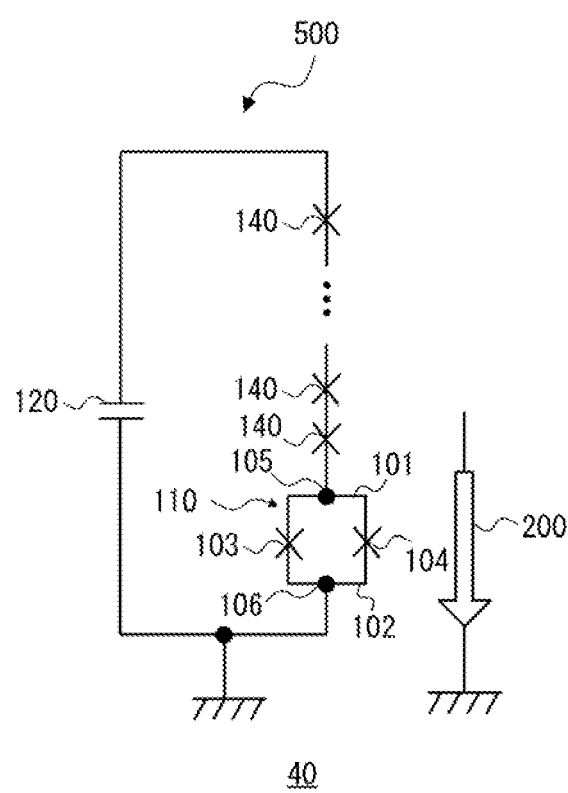
FIG. 6 is a schematic diagram showing a configuration of an oscillator according to a third modified example.

Next, a third modified example will be described. FIG. 6 is a schematic diagram showing an example of a superconducting nonlinear oscillator (Josephson parametric oscillator) according to a third modified example. As shown in FIG. 6, an oscillator 40 includes a resonator 500 and a magnetic-field generation unit 200. The resonator 500 includes a loop circuit 110, Josephson junctions 140, and a capacitor 120. The loop circuit 110 includes a first superconducting line 101 that connects a first Josephson junction 103 and a second Josephson junction 104, and a second superconducting line 102 that connects the first and second Josephson junctions 103 and 104. In other words, the resonator 500 includes the loop circuit 110 in which the first and second superconducting lines 101 and 102 are joined by the first and second Josephson junctions 103 and 104. As shown in FIG. 6, the first superconducting line 101, the first Josephson junction 103, the second superconducting line 102, and the second Josephson junction 104 are connected in a ring shape, thereby forming the loop circuit 110. In other words, in the loop circuit 110, the first and second superconducting lines 101 and 102 are joined by the first and second Josephson junctions 103 and 104, thereby forming a loop. In this modified example, the resonator 500 includes one loop circuit 110. However, as shown in a modified example described later, the resonator 500 may include a plurality of loop circuits 110.

The Josephson junctions 140 are those provided separately from the Josephson junctions 103 and 104 included in the loop circuit 110. The resonator 500 includes at least one Josephson junction 140. That is, the resonator 500 may include a plurality of Josephson junctions 140. The Josephson junctions 140 and the loop circuit 110 are connected in series. Note that although a plurality of Josephson junctions 140 are connected in series with one another as a group of junctions (i.e., connected in series with each other in one place) in FIG. 6, the order of these junctions may be arbitrarily determined. Therefore, for example, the loop circuit 110 and the Josephson junctions 140 may be connected in series so that they are arranged in an alternate manner.

In the loop circuit 110, a first part 105 in the first superconducting line 101 and a second part 106 in the second superconducting line 102 are used for this series connection. That is, the first and second parts 105 and 106 serve as connection points in the series connection.

Further, in the Josephson junctions 140, both terminals of the Josephson junctions 140 serve as connection points in the series connection.

A circuit in which the loop circuit 110 and the Josephson junctions 140 are connected in series is shunted by the capacitor 120. That is, it can be said that, by connecting the loop circuit 110, the Josephson junctions 140, and the capacitor 120 in a ring shape, a loop circuit in which the loop circuit 110 is incorporated on the line of the loop is formed. Note that as shown in FIG. 6, the loop circuit in which the loop circuit 110, the Josephson junctions 140, and the capacitor 120 are connected in a ring shape may be connected to the ground.

The magnetic-field generation unit 200 and the resonator 500 are magnetically coupled with each other through the mutual inductance. In other words, the magnetic-field generation unit 200 and the resonator 500 are inductively coupled with each other. In the configuration shown in FIG. 6, parametric oscillation is also performed by the generation of an alternating magnetic field. That is, when an AC current is fed to the magnetic-field generation unit 200 so that an alternating magnetic field whose frequency is twice the resonance frequency of the resonator 500 is applied to the loop circuit 110, the oscillator 40 oscillates at this resonance frequency (i.e., the oscillation frequency 0.5 times (i.e., a half of) the frequency of the alternating magnetic field). Note that the frequency of the alternating magnetic field is equal to the frequency of the AC current. Further, in this modified example, the oscillation frequency can be controlled by the amount of the current fed to the magnetic-field generation unit 200. Although the magnetic-field generation unit 200 is represented by one wiring line in FIG. 6, it may be formed by two wiring lines, and may be configured so that the DC current flows through one of the wiring lines and the AC current flows through the other wiring line.

The nonlinear coefficient of the oscillator 40 shown in FIG. 6 will be examined hereinafter. An approximate expression of the Hamiltonian H of the oscillator 40 shown in FIG. 6 (the Hamiltonian H of the resonator 500) is expressed by the below-shown Expression (12).

[Expression 12]

$$H = hf_0 a^\dagger a - \frac{E_C}{12} \frac{1+(N-1)\alpha^3}{(1+(N-1)\alpha)^3}(a^\dagger + a)^4 \quad (12)$$

In the Expression (12), h is the Planck's constant. Further, $f_0$ is the oscillation frequency of the oscillator 40. $a^\dagger$ is the generation operator. $\alpha$ is the annihilation operator. $E_C$ is the Josephson energy of one Josephson junction 140. N is the number of Josephson junctions 140. That is, N is an integer equal to or greater than one. $\alpha$ is a ratio of the critical current value of the loop circuit 110 to that of the Josephson junction 140. Note that the critical current values of the Josephson junctions 103 and 104 are equal to each other, and they are both represented by $I_{c1}$. Further, the critical current value of each of the Josephson junctions 140 is represented by $I_{c2}$. That is, a relation $\alpha = I_{c1}/I_{c2}$ holds. It can also be expressed that the critical current value $I_{c1}$ of the loop circuit 110 is $\alpha$ times the critical current value $I_{c2}$ of the Josephson junction 140.

The nonlinear coefficient of a nonlinear oscillator is defined by the coefficient of the nonlinear term of the Hamiltonian of the nonlinear oscillator, and is proportional to the coefficient of the nonlinear term. In the Hamiltonian in the Expression (12), the second term, i.e., the term $(a^\dagger + a)^4$, is the nonlinear term. Therefore, the value of the nonlinear coefficient of the oscillator 40 is proportional to the coefficient of the term $(a^\dagger + a)^4$. As can be seen from the Expression (12), the coefficient of the nonlinear term decreases as the number N of Josephson junctions 140 increases. This is because while the numerator of the coefficient of the nonlinear term changes in proportion to the first power of N, the denominator changes in proportion to the third power of N. This means that the nonlinearity of the oscillator 40 can be freely designed by changing the number N of Josephson junctions 140. That is, it is possible to reduce the nonlinearity coefficient according to the number N of Josephson junctions 140.

As described above, in this modified example, the resonator is not formed by the ring-shaped circuit composed solely of the loop circuit 110 and the capacitor 120, but is formed by the circuit in which the loop circuit 110, the Josephson junctions 140, and the capacitor 120 are connected in a ring shape. In this way, it is possible to freely design the nonlinearity of the oscillator 40 by changing the number N of Josephson junctions 140. That is, it is possible to lower the magnitude of the nonlinearity coefficient to a moderate value required for a quantum computer without increasing the loss of the oscillator.

Fourth Modified Example

Figure 7:
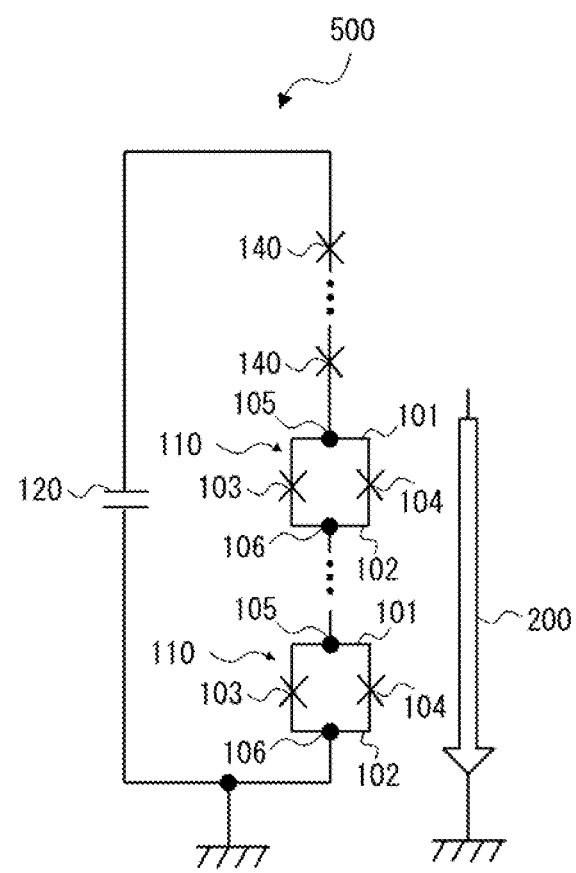
FIG. 7 is a schematic diagram showing a configuration of an oscillator according to a fourth modified example.

In the above-described third modified example, the resonator 500 includes one loop circuit 110. However, as shown in FIG. 7, the resonator 500 may include a plurality of loop circuits 110. The resonator 500 shown in FIG. 7 includes a plurality of loop circuits 110, at least one Josephson junction 140, and a capacitor 120.

In the fourth modified example, the Josephson junctions 140 and the loop circuits 110 are also connected in series. Note that although a plurality of Josephson junctions 140 are connected in series with one another as a group of junctions (i.e., in one place) and a plurality of loop circuits 110 are connected in series with one another as a group of loop circuits (i.e., in another place) in FIG. 7, the order of these Josephson junctions and loop circuits may be arbitrarily determined. Therefore, for example, the loop circuits 110 and the Josephson junctions 140 may be connected in series so that they are arranged in an alternate manner.

Further, in the fourth modified example, in the loop circuits 110, the first and second parts 105 and 106 also serve as connection points in the series connection. Further, in the Josephson junctions 140, both terminals of the Josephson junctions 140 serve as connection points in the series connection.

In the fourth modified example, a circuit in which a plurality of loop circuits 110 and at least one Josephson junction 140 are connected in series is shunted by the capacitor 120. That is, it can be said that, by connecting a plurality of loop circuits 110, at least one Josephson junction 140, and the capacitor 120 in a ring shape, a loop circuit in which the plurality of loop circuits 110 are incorporated on the line of the loop is formed. Note that as shown in FIG. 7, the loop circuit in which the loop circuits 110, the Josephson junctions 140, and the capacitor 120 are connected in a ring shape may be connected to the ground.

In the fourth modified example, the magnetic-field generation unit 200 also generates an alternating magnetic field and applies the generated alternating magnetic field to the loop circuits 110. However, while the magnetic-field generation unit 200 applies an alternating magnetic field to one loop circuit 110 in the third modified example, the magnetic-field generation unit 200 applies an alternating magnetic field to the plurality of loop circuits 110 in the fourth modified example. Therefore, the wiring line of the magnetic-field generation unit 200 has a length that is determined according to the number of loop circuits 110. Although the magnetic-field generation unit 200 is also represented by one wiring line in the fourth modified example shown in FIG. 7, it may be formed by two wiring lines, and may be configured so that the DC current flows through one of the wiring lines and the AC current flows through the other wiring line.

When an AC current is fed to the magnetic-field generation unit 200 so that an alternating magnetic field whose frequency is twice the resonance frequency of the resonator 500 is applied to each of the loop circuits 110, the oscillator 40 oscillates at this resonance frequency (i.e., the oscillation frequency 0.5 times (i.e., a half of) the frequency of the alternating magnetic field).

The nonlinear coefficient of the oscillator 40 shown in FIG. 7 will be examined hereinafter. As described above, each of the loop circuits 110 is a circuit including Josephson junctions 103 and 104. Therefore, by regarding the loop circuit 110 as a circuit equivalent to Josephson junctions, it can be considered that increasing the number of loop circuits 110 to a plural number as in the case of this modified example is equivalent to increasing the number of Josephson junctions. As understood from the above-shown the Expression (12), the magnitude of the nonlinearity coefficient decreases according to the number of Josephson junctions. Therefore, the magnitude of the nonlinearity coefficient of the oscillator 40 decreases as the number of loop circuits 110 is increased. Therefore, the number of loop circuits 110 provided in the oscillator 40 does not necessarily have to be one. However, for the below-described reason, the number of loop circuits 110 is preferably one.

The loop circuit 110, i.e., the DC-SQUID, is a circuit that is affected by noises of the magnetic field. Therefore, as the number of loop circuits is increased, the circuits become more sensitive to the noises of the magnetic field, thus possibly increasing the probability of the malfunction of the circuits. Further, the length of the wiring line of the magnetic-field generation unit 200 for uniformly applying the magnetic field to the plurality of loop circuits 110 increases according to the number of loop circuits 110. Therefore, the number of the loop circuits 110 is preferably one.

Fifth Modified Example

Figure 8:
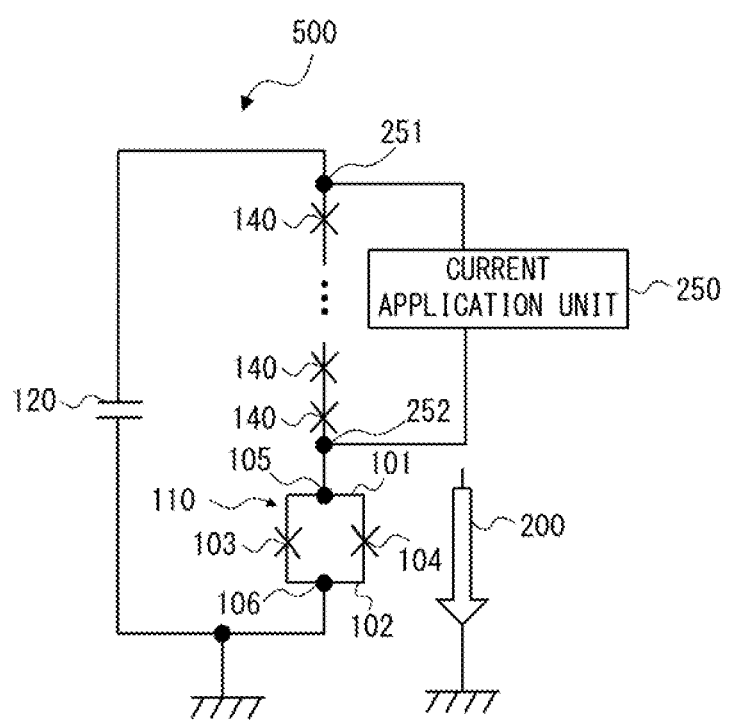
FIG. 8 is a schematic diagram showing a configuration of an oscillator according to a fifth modified example.

Next, a fifth modified example will be described. FIG. 8 is a schematic diagram showing an example of a superconducting nonlinear oscillator (Josephson parametric oscillator) according to a fifth modified example. This modified example differs from the third modified example because the oscillator further includes a current application unit 250. The current application unit 250 is a circuit that applies a DC current having a predetermined current value to the Josephson junctions 140. In the example shown in FIG. 8, the input and output terminals of the current application unit 250 are connected to one end 251 and the other end 252 of a circuit composed of all the Josephson junctions 140 connected in series. In this way, a closed circuit including the current application unit 250 and the Josephson junctions 140 is formed. Therefore, the DC current output from the current application unit 250 flows through all the Josephson junctions 140 and returns to the current application unit 250.

Note that the equivalent inductance $L_J$ of the Josephson junction 140 is expressed by the below-shown Expression.

[Expression 13]

$$L_J = \frac{\Phi_0}{2\pi I_C} \frac{1}{\sqrt{1 - (I/I_C)^2}} \quad (13)$$

In the Expression (13), $\Phi_0$ is the magnetic flux quantum (about $2.07 \times 10^{-15}$ Wb), and $I_C$ is the critical current value of the Josephson junction 140. Further, I is the current flowing through the Josephson junction 140. From the above-shown Expression, it can be understood that the equivalent inductance $L_J$ of the Josephson junction 140 can be changed by changing the current I flowing through the Josephson junction 140. That is, it is possible to control the equivalent inductance $L_J$ of the Josephson junction 140 by controlling the current flowing from the current application unit 250 to the Josephson junction 140.

Similarly to a simple LC resonant circuit, the resonance frequency of the resonator 500 depends on the inductance and the capacitance of the resonator 500. That is, the resonance frequency of the resonator 500 can be changed by changing the inductance thereof. In this modified example, the equivalent inductance $L_J$ of the Josephson junction 140 can be controlled by having the current application unit 250 feed a DC current to the Josephson junction 140. In this way, it is also possible to control the equivalent inductance of the whole resonator 500, and as a result, to control the resonance frequency of the resonator (i.e., the oscillation frequency of the oscillator 41). As described above, this modified example further provides an advantageous effect that it is possible to implement frequency control other than the control of the resonance frequency by the DC current flowing through the magnetic-field generation unit 200.

Note that although the current application unit 250 is connected so that the DC current is fed to all the Josephson junctions 140 in the example shown in FIG. 8, the current application unit 250 may be connected so that the DC current is applied to some of the Josephson junctions 140.

Further, although the plurality of Josephson junctions 140 are connected together in series and the plurality of loop circuits 110 are connected together in series in FIG. 8, the order of these components is arbitrarily determined. Therefore, for example, the loop circuit 110 and the Josephson junctions 140 may be connected in series so that they are arranged in an alternate manner.

Sixth Modified Example

Figure 9:
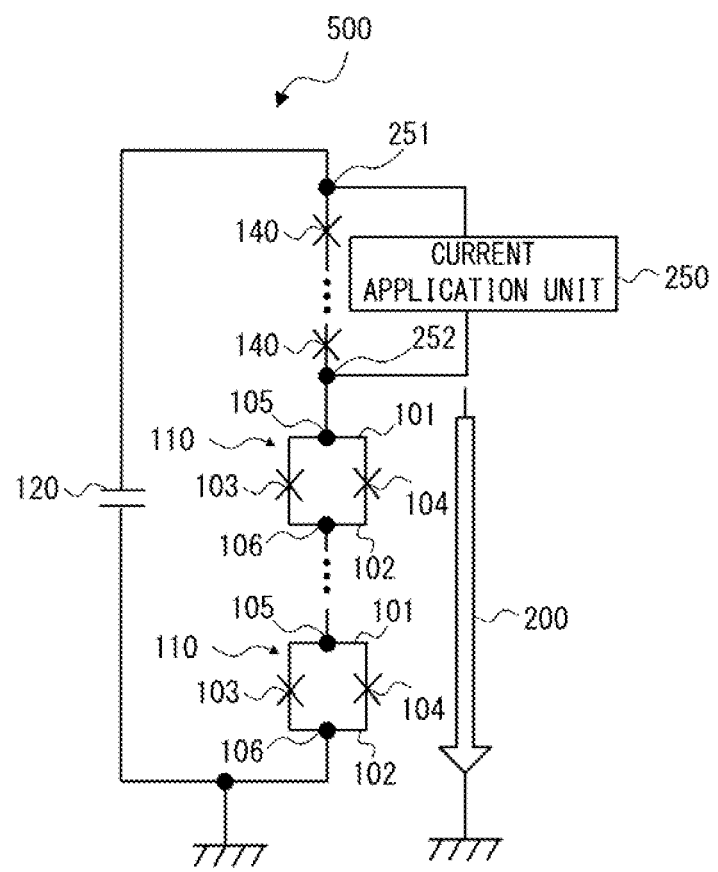
FIG. 9 is a schematic diagram showing a configuration of an oscillator according to a sixth modified example.

A modified example similar to the fourth modified example is conceivable for the fifth modified example. That is, as shown in FIG. 9, the resonator 500 of the oscillator 41 may include a plurality of loop circuits 110. Since the configuration of the sixth modified example is similar to that of the fourth modified example, except for the addition of the current application unit 250, the descriptions of details of the configuration are omitted as appropriate.

In this modified example, the current application unit 250 may be connected so that the DC current is applied to some of the Josephson junctions 140.

Further, although a plurality of Josephson junctions 140 are connected together in series and a plurality of loop circuits 110 are connected together in series in FIG. 9, the order of these components is arbitrarily determined. Therefore, for example, the loop circuit 110 and the Josephson junctions 140 may be connected in series so that they are arranged in an alternate manner.

The first to sixth modified examples have been described above as examples of resonators in which the capacitor 120 and the loop circuit(s) 110 are connected in a ring shape. However, the resonator which can be adopted in this example embodiment may be any type of resonator having a configuration in which, for example, the capacitor 120 and the loop circuit(s) 110 are connected in a ring shape. Further, its specific configuration is not limited to the above-described configurations.

Next, another example embodiment will be described. Note that in the following description, the same reference numerals (or symbols) are used for the same components that are already described above and detailed descriptions thereof are omitted as appropriate. In the first example embodiment, it is possible to easily perform reading-out while reducing the loss by changing the oscillation frequency in quantum calculation and that in reading-out from each other. In contrast, in the second and third example embodiments described hereinafter, the above-described effect is obtained by making the coupling strength between the oscillator and the read-out unit variable.

Overview of Second and Third Example Embodiments

Firstly, an overview of second and third example embodiments will be described.

Figure 10:
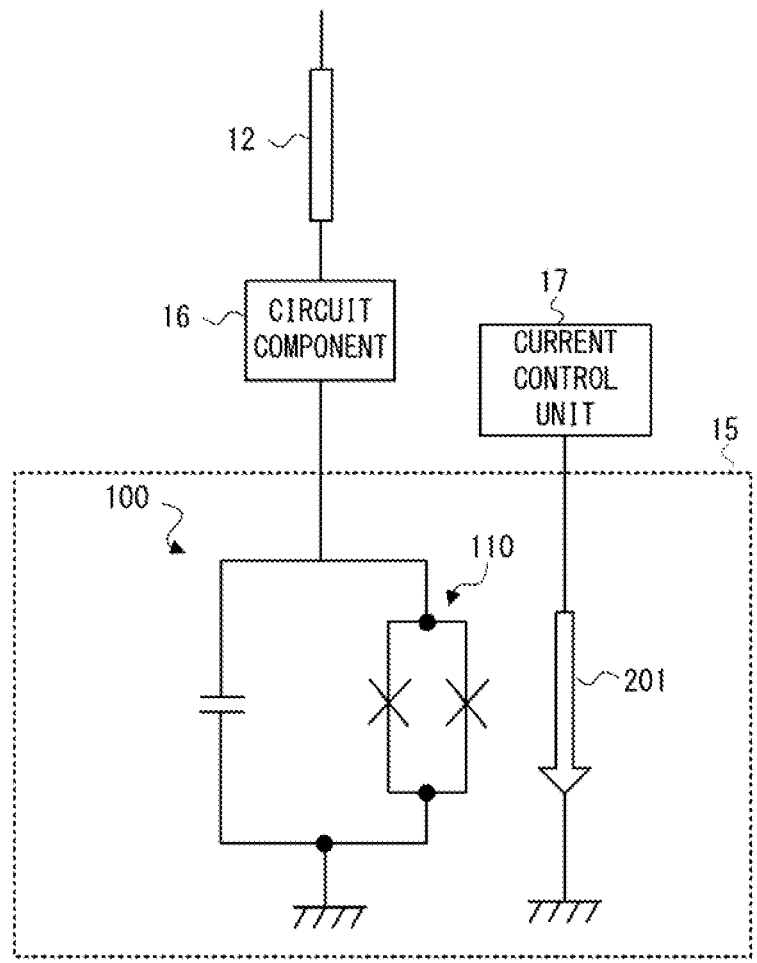
FIG. 10 is a schematic diagram showing a configuration of an oscillation apparatus according to an outline of second and third example embodiments.

FIG. 10 shows a schematic diagram of an oscillation apparatus 2 according to the overview of the second and third example embodiments. As shown in FIG. 10, the oscillation apparatus 2 includes an oscillator 15 that performs parametric oscillation, a current control unit 17, a read-out unit 12 that reads out the internal state of the oscillator 15, and a circuit component 16 provided between the oscillator 15 and the read-out unit 12. The oscillator 15 and the read-out unit 12 are connected to each other through the circuit component 16. More specifically, the circuit component 16 is connected to a shunt circuit (a circuit that shunts the loop circuit 110 by the capacitor 120). That is, the circuit component 16 is connected to a ring circuit formed by the capacitor 120 and the loop circuit 110. The circuit component 16 is a component in which a coupling strength between the oscillator 15 and the read-out unit 12 is variable.

The oscillator 15 includes the above-described resonator 100 and a magnetic-field generation unit 201. The magnetic-field generation unit 201 and the resonator 100 are magnetically coupled with each other through the mutual inductance. In other words, the magnetic-field generation unit 201 and the resonator 100 are inductively coupled with each other.

The magnetic-field generation unit 201 is a circuit that generates an alternating magnetic field and applies the generated alternating magnetic field to the loop circuit 110 of the resonator 100. The magnetic-field generation unit 201 is a circuit through which an AC current flows, and generates an alternating magnetic field by the AC current. More specifically, a current in which a DC current and an AC current are superimposed flows through the magnetic-field generation unit 201. However, the magnetic-field generation unit 201 differs from the magnetic-field generation unit 200 according to the first example embodiment in the following points. In the magnetic-field generation unit 200 according to the first example embodiment, the current is controlled so that the AC current for causing parametric oscillation flows therethrough at the time of quantum calculation, but the AC current for causing parametric oscillation does not flow therethrough at the time of reading-out. In contrast, the magnetic-field generation unit 201 is controlled by the current control unit 17 so that an AC current for causing parametric oscillation continuously flows therethrough not only at the time of quantum calculation but also at the time of reading-out. Although the magnetic-field generation unit 201 is represented by one wiring line in FIG. 10, it may be formed by two wiring lines, and may be configured so that the DC current flows through one of the wiring lines and the AC current flows through the other wiring line.

When an AC current is fed to the magnetic-field generation unit 201 so that an alternating magnetic field whose frequency is twice the resonance frequency of the resonator 100 is applied to the loop circuit 110, the oscillator 15 oscillates at this resonance frequency (i.e., the oscillation frequency 0.5 times (i.e., a half of) the frequency of the alternating magnetic field).

The current control unit 17 is a control circuit that controls the current flowing through the magnetic-field generation unit 201.

According to the configuration shown in FIG. 10, the coupling strength between the oscillator 15 and the read-out unit 12 can be changed by the circuit component 16. Therefore, it is possible to change the coupling strength at the time of quantum calculation and that at the time of reading-out from each other. Therefore, according to the configuration shown in FIG. 10, it is possible to realize a lumped constant-type oscillator in which reading-out can be easily performed while reducing the loss. In other words, according to the configuration shown in FIG. 10, it is possible to realize a nonlinear oscillator capable of reducing the loss at a first time point and easily reading out the state of the oscillator at a second time point after the first time point, and to prevent the circuit of the nonlinear oscillator from occupying a large area.

Specifically, the oscillation apparatus 2 can be controlled as follows. Firstly, at a first time point (at the time of quantum calculation), the coupling strength between the oscillator 15 and the read-out unit 12 is set to a first coupling strength, and the oscillator 15 is made to perform parametric oscillation. Next, at a second time point (at the time of reading-out), the coupling strength between the oscillator 15 and the read-out unit 12 is set to a second coupling strength stronger than the first coupling strength, and the internal state of the oscillator 15 is read out by the read-out unit 12. In this way, it is possible to realize a nonlinear oscillator capable of reducing the loss at a first time point and easily reading out the state of the oscillator at a second time point, and to prevent the circuit of the nonlinear oscillator from occupying a large area.

Note that, in the configuration shown in FIG. 10, the resonator 300 shown in FIG. 4 may be used in place of the resonator 100, or the resonator 400 shown in FIG. 5 may be used in place of the resonator 100. Further, the resonator 500 shown in FIG. 6 or 7 may be used in place of the resonator 100. In this case, the current application unit 250 may be added as shown in FIG. 8 or 9.

In the second example embodiment, a variable filter of which the bandwidth in which transmission of signals is restricted is variable is used as the circuit component. In contrast, in the third example embodiment, a variable capacitor having a variable capacitance is used as the circuit component. Specific configurations of the second and third example embodiments will be described hereinafter.

Second Example Embodiment

Figure 11:
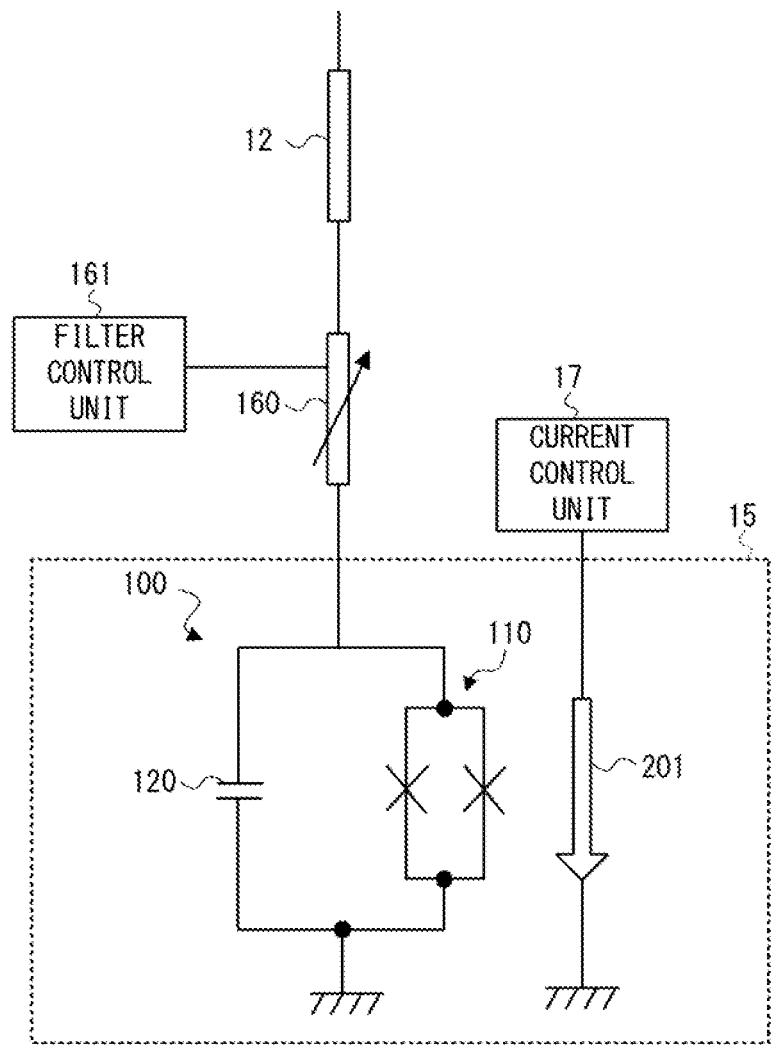
FIG. 11 is a schematic diagram showing an example of an oscillation apparatus according to the second example embodiment.

FIG. 11 is a schematic diagram showing an example of an oscillation apparatus 3 according to the second example embodiment.

As shown in FIG. 11, the oscillation apparatus 3 includes an oscillator 15 which is a lumped constant-type superconducting nonlinear oscillator, a current control unit 17, a read-out unit 12, a variable filter 160, and a filter control unit 161. The oscillator 15 includes the above-described resonator 100 and the above-described magnetic-field generation unit 201. The current flowing through the magnetic-field generation unit 201 is controlled by the current control unit 17.

The current control unit 17 is a control circuit that controls the current flowing through the magnetic-field generation unit 201. The current control unit 17 feeds an AC current for causing parametric oscillation to the magnetic-field generation unit 201 at the time of quantum calculation and at the time of reading-out. More specifically, similarly to the current control unit 11 in the first example embodiment, the current control unit 17 performs control so that a current in which a DC current and an AC current having a predetermined frequency are superimposed is fed to the magnetic-field generation unit 201. However, while the current control unit 11 in the first example embodiment feeds an AC current to the magnetic-field generation unit 200 only at the time of quantum calculation, the current control unit 17 continuously feeds an AC current not only at the time of quantum calculation but also at the time of reading-out immediately after the quantum calculation.

In this example embodiment, when an AC current is fed to the magnetic-field generation unit 201 so that an alternating magnetic field whose frequency is twice the resonance frequency of the resonator 100 is applied to the loop circuit 110, the oscillator 15 also performs parametric oscillation at this resonance frequency (i.e., the oscillation frequency 0.5 times (i.e., a half of) the frequency of the alternating magnetic field). As described above, the supply of the AC current to the magnetic-field generation unit 200 is stopped at the time of reading-out in the first example embodiment. That is, in the first example embodiment, the AC current, which is a pump signal for parametric oscillation (an AC current having a frequency twice the resonance frequency), is supplied only at the time of quantum calculation, and is stopped to be supplied at the time of reading-out. In contrast, in this example embodiment and the third example embodiment described later, the AC current is continuously supplied to the magnetic-field generation unit 201 at the time of reading-out after the quantum calculation. That is, in this example embodiment and the third example embodiment described later, the pump signal is continuously supplied to the resonator 100. By continuously supplying the pump signal, it is possible to maintain the oscillating state of the nonlinear oscillator longer than when the supply of the pump signal is stopped. Therefore, the output signal from the resonator 100 becomes stronger than when the pump signal is stopped at the time of reading-out, so that reading-out becomes easier.

The oscillator 15 and the read-out unit 12 are connected to each other through the variable filter 160. That is, the variable filter 160 is interposed between the oscillator 15 and the read-out unit 12. More specifically, the variable filter 160 is connected to a shunt circuit (a circuit that shunts the loop circuit 110 by the capacitor 120), and the read-out unit 12 is connected to the variable filter 160.

The filter control unit 161 is a control circuit that controls the transmission band of the variable filter 160.

The variable filter 160 is a circuit that restricts the transmission of signals in a frequency band set by the control of the filter control unit 161, and is formed by a capacitor and an inductor. More specifically, the variable filter 160 is a circuit that restricts the transmission of signals in a predetermined frequency band as compared to the transmission of signals in other frequency bands based on the control of the filter control unit 161. Note that the variable filter 160 and the read-out unit 12 may be disposed on the chip on which the oscillator 15 is disposed, or may be disposed on a different chip.

The variable filter 160 can be implemented by using an arbitrary known technique. For example, as the variable filter 160, a filter using a method in which the dielectric constant of a ferroelectric material is controlled by the voltage may be used, or a superconducting filter using a Josephson junction(s) may be used.

Note that a superconducting filter using a Josephson junction(s) is a filter as described below. In general, a superconducting loop including a Josephson junction(s), that is, a circuit in which a Josephson junction(s) is inserted in the middle of a loop made of a superconducting material, can be regarded as an inductor. Further, the inductance of this circuit can be changed by changing the magnetic flux that passes through the loop of the circuit. Therefore, this circuit can be used as a variable inductor. For example, by using a variable inductor formed as described above as an inductor in a lumped constant-type band-pass filter, a variable filter is formed. In this variable filter, it is possible to change the transmission band by changing the inductance value of the variable inductor.

In this example embodiment, by the above-described configuration, the oscillation apparatus 3 operates as follows. Firstly, at the time of quantum calculation, the filter control unit 161 controls the variable filter 160 so that the transmission band of the variable filter 160 does not include the oscillation frequency of the oscillator 15. On the other hand, when the internal state of the oscillator 15 is read out after the quantum calculation is finished, the filter control unit 161 controls the variable filter 160 so that the transmission band of the variable filter 160 includes the oscillation frequency of the oscillator 15.

By controlling the variable filter 160 as described above, the oscillation frequency is outside the transmission band of the variable filter 160 at the time of quantum calculation, so that the loss of the oscillator 15 can be reduced. Further, at the time of reading-out, the oscillation frequency is within the transmission band of the variable filter 160, so that it is possible to strength the coupling between the oscillator 15 and the read-out unit 12, and thereby to easily perform reading-out.

Note that, in this example embodiment, the oscillation frequency of the oscillator 15 at the time of quantum calculation and that at the time of reading-out may be equal to each other, or may be changed from each other. The oscillation frequency of the oscillator 15 can be controlled by a method similar to that in the first example embodiment. That is, the oscillation frequency of the oscillator 15 can be controlled by controlling the value of the DC current fed to the magnetic-field generation unit 201.

As described above, this example embodiment provides an advantageous effect that the loss of the oscillator 15 can be reduced at the time of quantum calculation, and the coupling between the oscillator 15 and the read-out unit 12 can be strengthened at the time of reading out, so that the reading-out can be easily performed. Further, since the oscillator 15 is a lumped constant-type oscillator, the area occupied by the circuit can be reduced. Therefore, according to this example embodiment, it is possible to realize a nonlinear oscillator capable of reducing the loss at a first time point and easily reading out the state of the oscillator at a second time point, and to prevent the circuit of the nonlinear oscillator from occupying a large area.

Further, the above-described modified examples can also be applied to this example embodiment. That is, in this example embodiment, the resonator 300 shown in FIG. 4 may be used in place of the resonator 100, or the resonator 400 shown in FIG. 5 may be used in place of the resonator 100. Further, the resonator 500 shown in FIG. 6 or 7 may be used in place of the resonator 100. In this case, the current application unit 250 may be added as shown in FIG. 8 or 9. Further, the resonator which can be adopted in this example embodiment is not limited to the above-described modified examples, and may be any type of resonator having a configuration in which, for example, the capacitor 120 and the loop circuit(s) 110 are connected in a ring shape.

Third Example Embodiment

Figure 12:
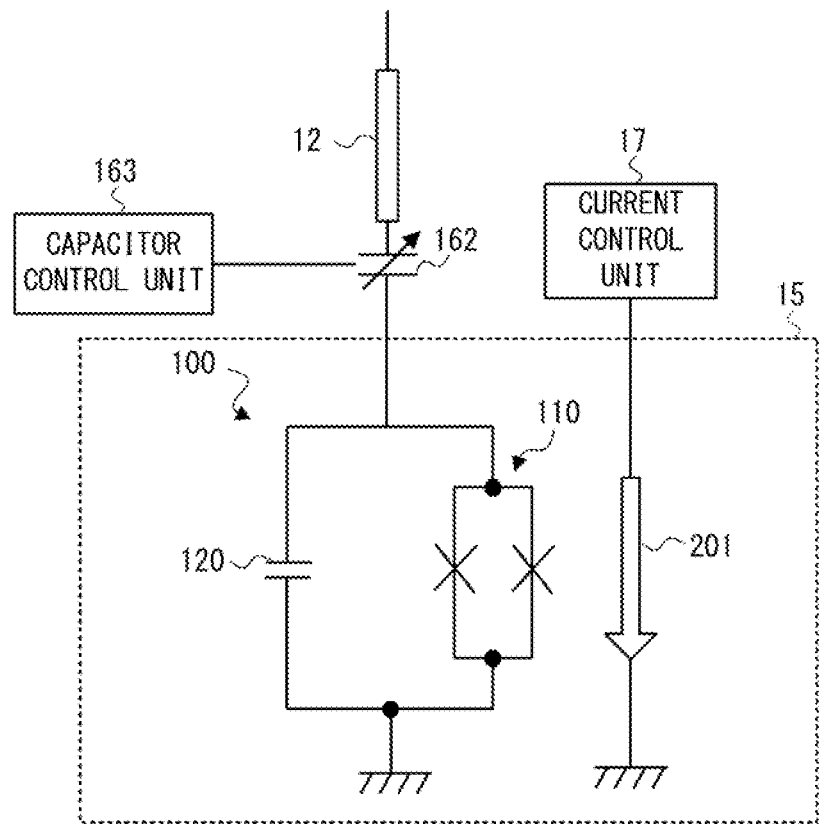
FIG. 12 is a schematic diagram showing an example of an oscillation apparatus according to the third example embodiment.

FIG. 12 is a schematic diagram showing an example of an oscillation apparatus 4 according to a third example embodiment.

As shown in FIG. 12, the oscillation apparatus 4 includes the above-described oscillator 15, a read-out unit 12, a variable capacitor 162, and a capacitor control unit 163. Since the oscillator 15 and the read-out unit 12 are similar to those in the second example embodiment, descriptions thereof will be omitted. Note that, as described above, in this example embodiment, the pump signal is continuously supplied to the resonator 100 at the time of reading-out after the quantum calculation. Therefore, the output signal from the resonator 100 becomes stronger than when the pump signal is stopped at the time of reading-out, so that reading-out becomes easier.

The oscillator 15 and the read-out unit 12 are connected with each other through the variable capacitor 162. That is, the variable capacitor 162 is interposed between the oscillator 15 and the read-out unit 12. More specifically, one end of the variable capacitor 162 is connected to the shunt circuit of the resonator 100 (the circuit that shunts the loop circuit 110 by the capacitor 120), and the other end thereof is connected to the read-out unit 12.

The capacitor control unit 163 is a control circuit that controls the capacitance of the variable capacitor 162.

The variable capacitor 162 is a circuit that provides a capacitance according to a control signal from the capacitor control unit 163. The variable capacitor 162 can be implemented by using an arbitrary known technique, such as a method for controlling the dielectric constant of a ferroelectric material by the voltage. Note that the variable capacitor 162 and the read-out unit 12 may be disposed on the chip on which the oscillator 15 is disposed, or may be disposed on a different chip.

In this example embodiment, by the above-described configuration, control is performed so that the value of the capacitance of the variable capacitor 162 at a first time point (at the time of quantum calculation) becomes smaller than the value of the capacitance of the variable capacitor 162 at a second time point (at the time of reading-out) after the first time point. The coupling strength between the oscillator 15 and the read-out unit 12 is controlled by changing the capacitance. The smaller the capacitance is, the smaller the coupling strength becomes. Conversely, the larger the capacitance is, the larger the coupling strength becomes.

More specifically, the oscillation apparatus 4 operates as follows. Firstly, at the time of quantum calculation, the capacitor control unit 163 sets the capacitance of the variable capacitor 162 to a predetermined first capacitance value. The first capacitance value is a value equal to or smaller than a predetermined first reference value. In this way, the coupling between the oscillator 15 and the read-out unit 12 is weakened, so that the loss of the oscillator 15 is reduced. On the other hand, when the internal state of the oscillator 15 is read out after the quantum calculation is finished, the capacitor control unit 163 sets the capacitance of the variable capacitor 162 to a predetermined second capacitance value. The second capacitance value is a value equal to or larger than a predetermined second reference value. Further, the second capacitance value is larger than the first capacitance value. In this way, the coupling between the oscillator 15 and the read-out unit 12 is strengthened, so that reading-out can be easily performed. By controlling the capacitance of the variable capacitor 162 as described above, it provides an advantageous effect that the loss of the oscillator 15 can be reduced at the time of quantum calculation, and reading-out can be easily performed at the time of reading-out. In this example embodiment, the oscillation frequency of the oscillator 15 at the time of quantum calculation and that at the time of reading-out may also be equal to each other, or may be changed from each other.

Note that since the first reference value is an index value for the value of the capacitance used at the time of quantum calculation, the first reference value is preferably as small as possible. This is because when the value of the capacitance is large, a lot of energy in the oscillator 15 flows out to the read-out unit 12, and the Q-value of the oscillator 15 decreases. In the other words, this is because the loss of the oscillator 15 increases and therefore the time in which the quantum state can be maintained (so-referred to as the coherence time) decreases.

Meanwhile, since the second reference value is an index value for the capacitance value when the internal state of the oscillator 15 is read out, the second reference value is preferably made as large as possible. This is because the larger the value of the capacitance is, the easier the energy in the oscillator 15 can be made to flow to the read-out unit 12. Therefore, reading-out can be easily performed. As a practical value, the first reference value is, for example, equal to or smaller than 0.1 fF, and the second reference value is, for example, equal to or larger than 10 fF.

As described above, this example embodiment provides an advantageous effect that the loss of the oscillator 15 can be reduced at the time of quantum calculation, and the coupling between the oscillator 15 and the read-out unit 12 can be strengthened at the time of reading out, so that the reading-out can be easily performed. Further, since the oscillator 15 is a lumped constant-type oscillator, the area occupied by the circuit can be reduced. Therefore, according to this example embodiment, it is possible to realize a nonlinear oscillator capable of reducing the loss at a first time point and easily reading out the state of the oscillator at a second time point, and to prevent the circuit of the nonlinear oscillator from occupying a large area.

Further, the above-described modified examples can also be applied to this example embodiment. That is, in this example embodiment, the resonator 300 shown in FIG. 4 may be used in place of the resonator 100, or the resonator 400 shown in FIG. 5 may be used in place of the resonator 100. Further, the resonator 500 shown in FIG. 6 or 7 may be used in place of the resonator 100. In this case, the current application unit 250 may be added as shown in FIG. 8 or 9. Further, the resonator which can be adopted in this example embodiment is not limited to the above-described modified examples, and may be any type of resonator having a configuration in which, for example, the capacitor 120 and the loop circuit(s) 110 are connected in a ring shape.

Fourth Example Embodiment

Next, an example embodiment in which the oscillation apparatus 1, 3 or 4 disclosed in the above-described example embodiment is used as a quantum-bit circuit for a quantum computer will be described. Note that the term "quantum computer" means a quantum annealing-type computer that calculates a solution of an arbitrary problem that can be mapped onto an Ising model. As described above, the oscillation apparatus 1, 3 and 4 perform parametric oscillation when an alternating magnetic field having a frequency twice the resonance frequency is applied to the loop circuit 110. Note that the oscillation state can be either a first oscillation state or a second oscillation state the phases of which are different from each other by $\pi$. The first and second oscillation states correspond to quantum bits 0 and 1, respectively.

Figure 13:
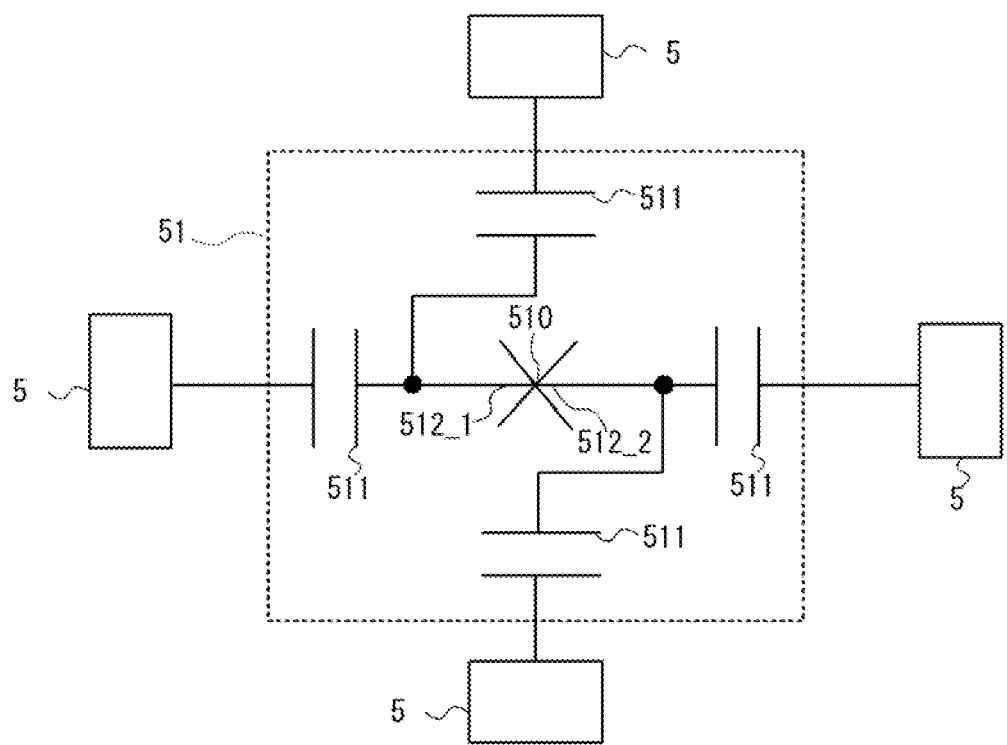
FIG. 13 is a schematic diagram showing a configuration of a quantum computer using an oscillation apparatus.

FIG. 13 shows a schematic diagram showing a configuration of a quantum computer using an oscillation apparatus shown in one of the example embodiments. The configuration shown in FIG. 13 is a configuration in which the above-described oscillation apparatus 1, 3 or 4 is applied as the oscillation apparatus in the configuration of the quantum computer using the distributed constant-type superconducting parametric oscillation apparatus disclosed in Non-patent Literature 1. More specifically, the configuration shown in FIG. 13 is, for example, one in which the above-described oscillation apparatus 1, 3 or 4 is applied in place of the distributed constant-type superconducting parametric oscillation apparatus in the configuration shown in FIG. 4 of Non-patent Literature 1. In FIG. 13, the oscillation apparatus 5 represents the oscillation apparatus 1, 3 or 4.

In the quantum computer 50 shown in FIG. 13, four oscillation apparatuses 5 are connected by one coupling circuit 51. More specifically, when the oscillation apparatus 5 includes the resonator 100, the coupling circuit 51 is connected to the shunt circuit of the resonator 100 (the circuit that shunts the loop circuit 110). Similarly, when the oscillation apparatus 5 includes the resonator 300, the coupling circuit 51 is connected to the shunt circuit of the resonator 300 (the series circuit that is composed of the capacitor 120 and the linear inductor 130, and shunts the loop circuit 110). Further, when the oscillation apparatus 5 includes the resonator 400, the coupling circuit 51 is connected to the shunt circuit of the resonator 400 (the parallel circuit that is composed of the capacitor 120 and the linear inductor 130, and shunts the loop circuit 110). Further, when the oscillation apparatus 5 includes the resonator 500, the coupling circuit 51 is connected to the shunt circuit of the resonator 500 (the circuit that shunts the circuit in which the loop circuit 110 and the Josephson junction 140 are connected in series). The coupling circuit 51 is a circuit that couples the four oscillation apparatuses 5, and is formed by one Josephson junction 510 and four capacitors 511. More specifically, the coupling circuit 51 couples rings circuit each of which includes the capacitor 120 and the loop circuit 110 in oscillation apparatuses with each other. The coupling circuit 51 couples a first set of oscillation apparatuses composed of two of the four oscillation apparatuses 5 with a second set of oscillation apparatuses composed of the other two oscillation apparatuses 5 through the Josephson junction 510. Note that each of the first set of oscillation apparatuses is connected to a superconductor 512_1 through a respective capacitor 511. Further, each of the second set of oscillation apparatuses is connected to a superconductor 512_2 through a respective capacitor 511. Note that the superconductor 512_1 is a wiring line connected to one of the terminals of the Josephson junction 510, and the superconductor 512_2 is a wiring line connected to the other terminal of the Josephson junction 510. That is, it can be said that the superconductors 512_1 and 512_2 are joined by the Josephson junction 510.

That is, a first oscillation apparatus 5 in the first set of oscillation apparatuses is connected to one of the terminals of the Josephson junction 510 through a first capacitor 511. Further, a second oscillation apparatus 5 in the first set of oscillation apparatuses is connected to one of the terminals of the Josephson junction 510 through a second capacitor 511. Similarly, a third oscillation apparatus 5 in the second set of oscillation apparatuses is connected to the other terminal of the Josephson junction 510 through a third capacitor 511. Further, a fourth oscillation apparatus 5 in the second set of oscillation apparatuses is connected to the other terminal of the Josephson junction 510 through a fourth capacitor 511.

The current control unit 11 or 17 uses AC currents having frequencies different from each other for the four oscillation apparatuses 5. When the magnetic-field generation unit 200 or 201 is formed by two wiring lines, and a DC current is fed to one of the wiring lines and an AC current is fed to the other wiring line, the wiring line for the AC current may be a wiring line that is shared (i.e., commonly used) by a plurality of oscillation apparatuses 5. That is, the wiring line for the AC current may be formed so as to pass through (or pass near) the plurality of the oscillation apparatuses 5. In this case, in order to control the plurality of oscillation apparatuses 5, a plurality of current control units 11 or 17 are connected to the wiring line for the AC current, which is shared by the plurality of oscillation apparatuses 5. Further, AC currents having frequencies different from each other are superimposed by the current control units 11 or 17.

Note that, in the configuration shown in FIG. 13, the current control units 11 or 17 may be arranged in a distributed manner in order to control the respective oscillation apparatuses 5. Alternatively, the plurality of current control units 11 or 17 may be collectively disposed in one place. Similarly, the filter control unit 161, the capacitor control unit 163, or the current application unit 250 may be arranged in a distributed manner for the respective oscillation apparatuses 5 in order to control the respective oscillation apparatuses 5, or may be collectively disposed in one place. Further, only one read-out unit 12 may be provided for the plurality of oscillation apparatuses 5, and reading out of the plurality of oscillation apparatuses 5 may be performed by using this read-out unit 12. In this case, the common read-out unit 12 provided for the plurality of oscillation apparatuses 5 reads out the internal state of each of the oscillation apparatuses 5 while distinguishing them from each other according to the difference in the frequencies used in the respective oscillation apparatuses 5. Note that even when only one read-out unit 12 is provided for a plurality of oscillation apparatuses 5, the filter 13 according to the first example embodiment is provided for each of the oscillation apparatuses 5. That is, when only one read-out unit 12 is provided for a plurality of oscillation apparatuses 5, a plurality of filters 13 are connected to the one read-out unit 12.

Figure 14:
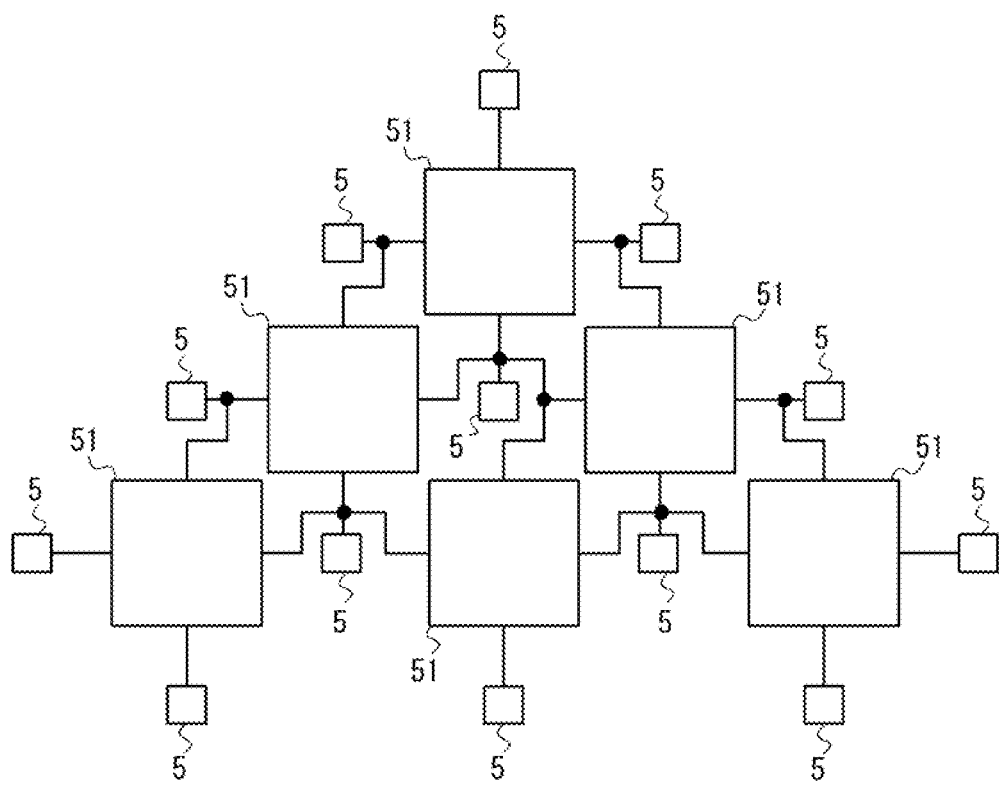
FIG. 14 is a schematic diagram showing a configuration of a quantum computer in which an oscillation apparatus is integrated.

Note that the configuration shown in FIG. 13 shows a configuration of a quantum computer including four oscillation apparatuses 5. However, it is possible to realize a quantum computer in which an arbitrary number of oscillation apparatuses 5 are integrated by using the configuration shown in FIG. 13 as a unit structure and connecting a plurality of such unit structures side by side. FIG. 14 shows an example of such a configuration. FIG. 14 shows a schematic diagram showing a configuration of a quantum computer 52 in which oscillation apparatuses 5 are integrated. In the configuration shown in FIG. 14, each coupling circuit 51 is connected to four oscillation apparatuses 5 as shown in FIG. 13. Further, each oscillation apparatus 5 is connected to one to four coupling circuits 51, and the oscillation apparatuses 5 are arranged while shared (i.e., commonly used) by a plurality of unit structures, so that the unit structures shown in FIG. 13 is obtained. In the quantum computer 52, at least one oscillation apparatus 5 is connected to a plurality of coupling circuits 51. In particular, in the example shown in FIG. 14, at least one oscillation apparatus 5 is connected to four coupling circuits 51. Further, the quantum computer 52 can also be described as follows. The quantum computer 52 includes a plurality of oscillation apparatuses 5, and each of the oscillation apparatuses 5 is connected to one to four coupling circuits 51. The number of coupling circuits 51 to which respective oscillation apparatuses 5 are connected corresponds to the number of unit structures in which these oscillation apparatuses 5 are shared. In this way, in the example shown in FIG. 14, the quantum computer 52 includes a plurality of unit structures, and oscillation apparatuses 5 are shared by a plurality of unit structures. Although 13 oscillation apparatuses 5 are integrated in the example shown in FIG. 14, an arbitrary number of oscillation apparatuses 5 can be integrated in a similar manner.

Note that the operating principle and the control method for a quantum computer are disclosed in Non-patent Literature 1, and the operating principle and the control method disclosed in Non-patent Literature 1 are also applied to the quantum computer shown in FIGS. 13 and 14.

According to this example embodiment, it is possible to realize a quantum computer capable of reducing the loss at the time of quantum calculation and easily reading out the state at the time of reading-out, and to prevent the circuit of the quantum computer from occupying a large area.

Note that a superconducting nonlinear oscillator according to the present disclosure can be applied to gate-type quantum computing circuits as well as to quantum annealing circuits.

Note that the present invention is not limited to the above-described example embodiments and various changes may be made therein without departing from the spirit and scope of the invention.

Further, the whole or part of the example embodiments disclosed above can be described as, but not limited to, the following supplementary notes.

(Supplementary Note 1)
An oscillation apparatus comprising:
an oscillator comprising a resonator and magnetic-field generating means, the resonator comprising a loop circuit and a capacitor, the loop circuit comprising a first superconducting line, a first Josephson junction, a second superconducting line, and a second Josephson junction connected in a ring shape, the magnetic-field generating means being configured to apply a magnetic field to the loop circuit, and the oscillator being configured to perform parametric oscillation;
read-out means for reading out an internal state of the oscillator; and
a circuit component in which a coupling strength between the oscillator and the read-out means is variable, wherein
a circuit in which the capacitor and the loop circuit are connected in a ring shape is connected to the read-out means through the circuit component.

(Supplementary Note 2)
The oscillation apparatus described in Supplementary note 1, wherein the circuit component is a variable filter of which a bandwidth in which transmission of a signal is restricted is variable.

(Supplementary Note 3)
The oscillation apparatus described in Supplementary note 1, wherein the circuit component is a variable capacitor having a variable capacitance.

(Supplementary Note 4)
The oscillation apparatus described in Supplementary note 1 or 2, wherein
the resonator further comprises a linear inductor; and
a circuit comprising the capacitor and the linear inductor and the loop circuit are connected in a ring shape.

(Supplementary Note 5)
The oscillation apparatus described in Supplementary note 4, wherein the capacitor and the linear inductor are connected in series.

(Supplementary Note 6)
The oscillation apparatus described in Supplementary note 4, wherein the capacitor and the linear inductor are connected in parallel.

(Supplementary Note 7)
The oscillation apparatus described in Supplementary note 1 or 2, wherein
the resonator further comprises at least one third Josephson junction provided separately from the Josephson junction included in the loop circuit, and
the loop circuit, the third Josephson junction, and the capacitor are connected in a ring shape.

(Supplementary Note 8)
The oscillation apparatus described in Supplementary note 7, wherein the number of the loop circuit is one.

(Supplementary Note 9)
The oscillation apparatus described in Supplementary note 7 or 8, further comprising current applying means for feeding a DC current to the third Josephson junction.

(Supplementary Note 10)
A quantum computer comprising, as a unit structure, four oscillation apparatuses each of which is one described in any one of Supplementary notes 1 to 9, and a coupling circuit configured to couple ring circuits with each other, each of the ring circuits including the capacitor and the loop circuit of a respective one of the four oscillation apparatuses.

(Supplementary Note 11)
The quantum computer described in Supplementary note 10, wherein
the coupling circuit couples a first set of oscillation apparatuses including two of the four oscillation apparatuses with a second set of oscillation apparatuses including the other two of the four oscillation apparatuses through a fourth Josephson junction,
a first oscillation apparatus of the first set of oscillation apparatuses is connected to one terminal of the fourth Josephson junction through a first capacitor,
a second oscillation apparatus of the first set of oscillation apparatuses is connected to the one terminal of the fourth Josephson junction through a second capacitor, a third oscillation apparatus of the second set of oscillation apparatuses is connected to the other terminal of the fourth Josephson junction through a third capacitor, and a fourth oscillation apparatus of the second set of oscillation apparatuses is connected to the other terminal of the fourth Josephson junction through a fourth capacitor.

(Supplementary Note 12)

The quantum computer described in Supplementary note 10 or 11, comprising a plurality of the unit structures, wherein the oscillation apparatus is commonly used by a plurality of the unit structures.

(Supplementary Note 13)

A control method comprising:

setting a coupling strength between an oscillator and read-out means for reading out an internal state of the oscillator to a first coupling strength, and making the oscillator perform parametric oscillation, the oscillator comprising a resonator and magnetic-field generating means, the resonator comprising a loop circuit and a capacitor, the loop circuit comprising a first superconducting line, a first Josephson junction, a second superconducting line, and a second Josephson junction connected in a ring shape, and the magnetic-field generating means being configured to apply a magnetic field to the loop circuit; and then, setting the coupling strength between the oscillator and the read-out means to a second coupling strength larger than the first coupling strength, and reading out, by the reading-out means, the internal state of the oscillator, wherein the capacitor and the loop circuit are connected in a ring shape.

Although the present invention is described above with reference to example embodiments, the present invention is not limited to the above-described example embodiments. Various modifications that can be understood by those skilled in the art can be made to the configuration and details of the present invention within the scope of the invention.

This application is based upon and claims the benefit of priority from Japanese patent application No. 2019-133816, filed on Jul. 19, 2019, the disclosure of which is incorporated herein in its entirety by reference.

REFERENCE SIGNS LIST 1, 2, 3, 4, 5 OSCILLATION APPARATUS
10 OSCILLATOR
11 CURRENT CONTROL UNIT
12 READ-OUT UNIT
13 FILTER
15 OSCILLATOR
16 CIRCUIT COMPONENT
17 CURRENT CONTROL UNIT
20, 30, 40, 41 OSCILLATORS
50 QUANTUM COMPUTER
51 COUPLING CIRCUIT
52 QUANTUM COMPUTER
100 RESONATOR
101, 102 SUPERCONDUCTING LINE
103, 104 JOSEPHSON JUNCTION
105 FIRST PART
106 SECOND PART
110 LOOP CIRCUIT
120 CAPACITOR
130 LINEAR INDUCTOR
140 JOSEPHSON JUNCTION
160 VARIABLE FILTER
161 FILTER CONTROL UNIT
162 VARIABLE CAPACITOR
163 CAPACITOR CONTROL UNIT
200, 201 MAGNETIC-FIELD GENERATION UNIT
250 CURRENT APPLICATION UNIT
300, 400, 500 RESONATOR
510 JOSEPHSON JUNCTION
511 CAPACITOR
512_1, 512_2 SUPERCONDUCTOR

The invention claimed is:

1. An oscillation apparatus comprising:
an oscillator comprising a resonator and a magnetic-field generating circuit, the resonator comprising a loop circuit and a capacitor, the loop circuit comprising a first superconducting line, a first Josephson junction, a second superconducting line, and a second Josephson junction connected in a ring shape, the magnetic-field generating circuit being configured to apply a magnetic field to the loop circuit, and the oscillator being configured to perform parametric oscillation;
a read-out circuit for reading out an internal state of the oscillator; and
a circuit component in which a coupling strength between the oscillator and the read-out circuit is variable, wherein
the resonator is connected to the read-out circuit through the circuit component, and the circuit component is:
a variable filter of which a bandwidth in which transmission of a signal is restricted is variable, or
a variable capacitor having a variable capacitance.

2. The oscillation apparatus according to claim 1, wherein the resonator further comprises a linear inductor; and
a circuit comprising the capacitor and the linear inductor and the loop circuit are connected in a ring shape.

3. The oscillation apparatus according to claim 2, wherein the capacitor and the linear inductor are connected in series.

4. The oscillation apparatus according to claim 2, wherein the capacitor and the linear inductor are connected in parallel.

5. The oscillation apparatus according to claim 1, wherein the resonator further comprises at least one third Josephson junction provided separately from the Josephson junction included in the loop circuit, and
the loop circuit, the third Josephson junction, and the capacitor are connected in a ring shape.

6. The oscillation apparatus according to claim 5, wherein the number of the loop circuit is one.

7. The oscillation apparatus according to claim 5, further comprising a current applying circuit for feeding a DC current to the third Josephson junction.

8. A quantum computer comprising, as a unit structure, four oscillation apparatuses each of which is one according to claim 1, and a coupling circuit configured to couple ring circuits with each other, each of the ring circuits including the capacitor and the loop circuit of a respective one of the four oscillation apparatuses.

9. The quantum computer according to claim 8, wherein the coupling circuit couples a first set of oscillation apparatuses including two of the four oscillation apparatuses with a second set of oscillation apparatuses including the other two of the four oscillation apparatuses through a fourth Josephson junction, a first oscillation apparatus of the first set of oscillation apparatuses is connected to one terminal of the fourth Josephson junction through a first capacitor, a second oscillation apparatus of the first set of oscillation apparatuses is connected to the one terminal of the fourth Josephson junction through a second capacitor, a third oscillation apparatus of the second set of oscillation apparatuses is connected to the other terminal of the fourth Josephson junction through a third capacitor, and a fourth oscillation apparatus of the second set of oscillation apparatuses is connected to the other terminal of the fourth Josephson junction through a fourth capacitor.

10. The quantum computer according to claim 8, comprising a plurality of the unit structures, wherein the oscillation apparatus is commonly used by a plurality of the unit structures.

11. The oscillation apparatus according to claim 1, further comprising a filter control circuit or a capacitor control circuit, wherein the circuit component is:

the variable filter that restricts the transmission of the signal in a frequency band set by a control of the filter control circuit, or the variable capacitor that provides a capacitance according to a control signal from the capacitor control circuit.

12. The oscillation apparatus according to claim 11, wherein the circuit component comprises a ferroelectric material, and a dielectric constant of ferroelectric material is controlled by a voltage from the filter control circuit or the capacitor control circuit.

13. The oscillation apparatus according to claim 11, wherein the circuit component is a superconducting filter using a Josephson junction.

14. A control method comprising:

setting a coupling strength between an oscillator and a read-out circuit for reading out an internal state of the oscillator to a first coupling strength, and making the oscillator perform parametric oscillation, the oscillator comprising a resonator and a magnetic-field generating circuit, the resonator comprising a loop circuit and a capacitor, the loop circuit comprising a first superconducting line, a first Josephson junction, a second superconducting line, and a second Josephson junction connected in a ring shape, and the magnetic-field generating circuit being configured to apply a magnetic field to the loop circuit; and then, setting the coupling strength between the oscillator and the read-out circuit to a second coupling strength larger than the first coupling strength, and reading out, by the reading-out circuit, the internal state of the oscillator, wherein the resonator is connected to the read-out circuit through a circuit component in which the coupling strength between the oscillator and the read-out circuit is variable, and the circuit component is:

a variable filter of which a bandwidth in which transmission of a signal is restricted is variable, or a variable capacitor having a variable capacitance.

15. The control method according to claim 14, wherein the circuit component is:

the variable filter that restricts the transmission of the signal in a frequency band set by a control of a filter control circuit, or the variable capacitor that provides a capacitance according to a control signal from a capacitor control circuit.

16. The oscillation apparatus according to claim 15, wherein the circuit component comprises a ferroelectric material, and a dielectric constant of ferroelectric material is controlled by a voltage from the filter control circuit or the capacitor control circuit.

17. The oscillation apparatus according to claim 15, wherein the circuit component is a superconducting filter using a Josephson junction.

* * * * *